United States Patent [19]

Curran

[11] Patent Number: 4,771,013
[45] Date of Patent: Sep. 13, 1988

[54] PROCESS OF MAKING A DOUBLE HETEROJUNCTION 3-D I²L BIPOLAR TRANSISTOR WITH A SI/GE SUPERLATTICE

[75] Inventor: Patrick A. Curran, Plano, Tex.

[73] Assignee: Texas Instruments Incorporated, Dallas, Tex.

[21] Appl. No.: 892,681

[22] Filed: Aug. 1, 1986

[51] Int. Cl.⁴ .................... H01L 27/04; H01L 21/20
[52] U.S. Cl. ........................... 437/31; 437/55;
437/106; 437/131; 437/174; 437/110; 437/111;
437/200; 148/DIG. 11; 148/DIG. 12;
148/DIG. 142; 148/DIG. 147; 148/DIG. 160;
148/DIG. 164; 148/DIG. 169; 156/613;
156/614; 357/34; 357/56; 357/92
[58] Field of Search ................ 29/576 E, 577 C;
148/1.5, 175, DIG. 10, DIG. 11, DIG. 12,
DIG. 40, DIG. 135, DIG. 164, DIG. 87, DIG.
72; 357/34, 67, 51

[56] References Cited

U.S. PATENT DOCUMENTS

| | | | |
|---|---|---|---|
| 3,508,980 | 4/1970 | Jackson, Jr. et al. | 148/DIG. 12 |
| 3,695,956 | 11/1972 | Speers | 148/DIG. 12 |
| 3,997,381 | 12/1976 | Wanlass | 148/DIG. 12 |
| 4,420,874 | 12/1983 | Funatsu | 29/576 W |
| 4,546,539 | 11/1985 | Beasom | 29/577 C |
| 4,612,083 | 9/1986 | Yasumoto et al. | 148/1.5 |
| 4,644,381 | 2/1987 | Shieh | 357/35 |
| 4,649,627 | 3/1987 | Abernathey et al. | 148/DIG. 64 |

OTHER PUBLICATIONS

Matsushita et al., "A Silicon Heterojunction Transistor", Appl. Phys. Lett., 35(7), 1 Oct. 1979, pp. 549–550.
Kroemer, "Heterostructure Bipolar Transistors and Integrated Circuits", Proceedings of IEEE, vol. 70, No. 1, Jan. 1982, pp. 13–25.
Declercq et al., "V-Groove Isolated I.I.L. Circuits", Electronics Letters, 18th Mar. 1976, vol. 12, No. 6, pp. 150–151.
Shiraki, "Silicon Molecular Beam Epitaxy", J. Vac. Sci. Technol., B3(2), Mar./Apr. 1985, pp. 725–729.
Ota, "Silicon Molecular Beam Epitaxy", Thin Solid Films, vol. 106, No. ½, Aug. 12, 1983, pp. 102–104.

*Primary Examiner*—Olik Chaudhuri
*Assistant Examiner*—William Bunch
*Attorney, Agent, or Firm*—Gary C. Honeycutt; Melvin Sharp; Rhys Merrett

[57] ABSTRACT

A three dimensional, bipolar wafer process for integrating high voltage, high power, analog, and digital circuitry, and structure formed thereby includes a wafer of non-compensated epitaxial strata on a heavily donor doped monocrystalline silicon substrate of <100> crystal orientation, which is etched and with three dimensional transistors formed in it. Passivation for and contacts to said circuits are established, and the circuits are interconnected. The high voltage and high power transistors include transistors of an H-bridge circuit, including at least one set of cascode double heterojunction transistors, the analog transistors include a bipolar transistor, and the digital transistors include transistors of a I²L circuit. One method for constructing the wafer is by sequentially epitaxially depositing each strata in an UHV silicon-based MBE apparatus. Another method is by constructing guest and host wafers, each containing respective portions of the strata, and fusing said guest and host wafers together.

38 Claims, 20 Drawing Sheets

PROCESS OF MAKING A DOUBLE HETEROJUNCTION 3-D I²L BIPOLAR TRANSISTOR WITH A SI/GE SUPERLATTICE

BACKGROUND OF THE INVENTION

1. Field of the Invention

This invention relates to integrated high level digital circuitry, precision analog circuitry, and power circuit structures on a monolithic semiconductor wafer, and more particularly to integrated circuitry and processes for realizing same, which result in cost effective high voltage, high power H-bridge or totem pole configurations, integrated along with precision analog circuitry and high density digital logic, and to circuitry incorporating such integrated circuitry which is particularly suitable for motor applications and the like.

2. Description of the Relevant Art

Many smart power integrated circuit applications require high voltage, high power H-bridge or totem pole configurations integrated along with precision analog circuitry and high density digital logic. This need is extremely prevalent in motor applications where cost is also of critical concern.

Although efforts have long been directed toward fully integrating high level digital circuitry, precision analog circuitry, and power circuit structures on a monolithic semiconductor wafer, success has not yet been achieved. Voltage breakdown considerations have generally forced power MOSFET approaches to be employed in lieu of bipolar implementations in order to avoid secondary breakdown effects. However, the breakdown voltage enhancement of MOSFET transistors is offset by the disadvantage of no conductivity modulation of the blocking region, which causes high ohmic drops in high voltage applications. Consequently, power MOSFET transistors require larger silicon area than bipolar transistors and have a reduced transconductance per unit area than bipolar transistors. Morever, the MOSFET transconductance is reduced at elevated temperatures due to mobility degradation. Furthermore, power MOSFET wafer fabrication is more complex than bipolar processing, and, as a result, power MOSFET devices are inherently more expensive than bipolar equivalents.

In addition to voltage breakdown considerations, power MOSFET devices have some other advantages over bipolar. Fast switching speeds without stored charge effects dramatically reduce power losses due to switching effects. Unlike bipolar devices, power MOSFETs have a high input impedance, although power MOSFETs also have a high input capacitance. Due to the input impedance and lack of stored charge, power MOSFET transistors offer simpler input drive techniques than bipolar transistors. In summary, power bipolar and power MOSFET transistors each have advantages and disadvantages.

Major voltage, charge, temperature, and electrical isolation problems exist in smart power integrations. The electrical isolation problem is due to the fact that power transistors are vertical current conductors with topside and backside power bus structures, while conventional integrated circuits employ lateral current conduction to some degree with the current conductors generally located on the wafer topside, and with the wafer backside reserved for component isolation. Thus, it is not possible to integrate, for instance, an H-bridge or totem pole circuit with conventional power transistors with electrical isolation. A true power implementation can be realized by a monolithic three-dimensional, non-planar wafer processing for which neither conventional bipolar or MOSFET power transistors are suitable.

Voltage isolation requires the ability to constrain high electric fields from one part of the die from influencing low voltage circuitry in the other part. Furthermore, it is difficult to prevent deleterious effects due to high electric fields on planar, oxide passivated wafers. The lack of charge isolation is due to long diffusion lengths associated with modern processing which allow parasitic charge injection from one part of the die to another resulting in deleterious circuit performance. The thermal coupling throughout the die tends to cause severe problems in the analog, and secondary problems in the digital circuitry, due to the heat generated in the power devices. Conventional wafer processing techniques do not lend themselves to proper electrical, voltage, charge, and thermal isolation to allow full smart power integration.

Merged technologies tend to increase process complexity and costs while reducing component performance. The high voltage devices dictate the non-compensated film characteristics. Low voltage devices are fabricated with whatever compromises are necessary to merge the components. Analog circuitry is best implemented by bipolar devices, normally employing inferior lateral PNP transistors in many circuit applications. Digital circuitry is often implemented by CMOS techniques which provide self-isolation at the expense of increased process complexity. CMOS implementations have the advantages of low power dissipation, high speed, and high packing density.

SUMMARY OF THE INVENTION

In light of the above, it is, therefore an object of the invention to provide fully integrated high level digital circuitry, precision analog circuitry, and power circuit structures on a monolithic semiconductor wafer, and to processes for fabricating same.

It is another object of the invention to provide fully integrated high level digital circuitry of the type described which can be implemented with bipolar devices.

It is another object of the invention to provide fully integrated high level digital circuitry of the type described in which requires less silicon area than conventional power MOSFET transistors and which has an increased transconductance per unit area in comparison to conventional MOSFET power transistors that is not reduced at elevated temperatures due to mobility degradation.

It is another object of the invention to provide fully integrated high level digital circuitry of the type described which avoids secondary breakdown effects encountered in conventional power bipolar implementations.

It is another object of the invention to provide fully integrated high level digital circuitry of the type described which avoids high ohmic drops encountered in high voltage applications using breakdown voltage enhanced MOSFET transistors.

It is another object of the invention to provide fully integrated high level digital circuitry of the type described in which wafer processing is less complex and cheaper than convention power MOSFET wafer fabrication.

It is another object of the invention to provide fully integrated high level digital circuitry of the type described which has faster switching speeds with reduced stored charge and reduced power losses due to switching effects.

It is another object of the invention to provide fully integrated high level digital circuitry of the type described in which H-bridge or totem circuits are integrated with bipolar power transistors, with electrical isolation.

It is another object of the invention to provide fully integrated high level digital circuitry of the type described which realizes a true power implementation by monolithic three-dimensional, non-planar wafer processing for which neither conventional bipolar or MOSFET power transistors are suitable.

It is another object of the invention to provide fully integrated high level digital circuitry of the type described in which deleterious effects due to high electric fields on planar, oxice passivated wafers are reduced.

It is another object of the invention to provide fully integrated high level digital circuitry of the type described in which high electric fields from one part of the die are constrained from influencing low voltage circuitry in another part.

It is another object of the invention to provide fully integrated high level digital circuitry of the type described in which parasitic charge injection from one part of the die to another are reduces or eliminated.

It is another object of the invention to provide fully integrated high level digital circuitry of the type described in which thermal coupling problems throughout the die due to the heat generated in the power devices are minimized in the associated analog and digital circuitry.

It is another object of the invention to provide fully integrated high level digital circuitry of the type described in lends itself to proper electrical, voltage, charge, and thermal isolation to allow full smart power integration.

These and other objects, features and advantages will become apparent to those skilled in the art from the following detailed description, when read in conjunction with the accompanying drawings and appended claims.

In accordance with a broad aspect of the invention, a bipolar wafer process employing double heterojunction transistors in a three dimensional, non-compensated epitaxial strata in order to efficiently integrate high voltage, high power, analog, and digital circuitry is disclosed. The process is well suited for motor applications and is extremely economical owing to the bipolar nature, minimal masking operations, large wafer diameter capability, and three dimensional aspect.

BRIEF DESCRIPTION OF THE DRAWING

The invention is illustrated in the accompanying drawing, in which.

In the various figures of the drawing, the sizes and dimensions of the various parts shown may be exaggerated or distorted for ease of description or clarity of illustration. Like reference numerals are used to denote like or similar parts.

DETAILED DESCRIPTION OF THE PREFERRED EMBODIMENTS

In accordance with a preferred embodiment of the invention, a cost effective process is disclosed to implement high performance, low cost integration of H-bridge power components, precision analog circuitry, and dense digital circuitry on a monolithic substrate. The process employs a three dimensional wafer process, and is totally bipolar.

All wafer processing is by non-planar, non-compensated fabrication techniques using beam transport, such as ultra high vacuum (UHV) molecular beam epitaxial (MBE) deposition. Although numerous lithographic techniques can be used, masked ion beam lithography is described herein. The process comprises forming the epitaxial strata, delineating components, performing passivation and contact, and establishing interconnections die contact.

In the formation of the epitaxial strata, as described below, it will be understood that the epitaxial processing is carried out at relatively low temperatures, for instance, less than about 700° C., to preclude thermal diffusions or perturbations of the hyperabrupt junctions. Thus, the epitaxial growth enables the various films to be so atomically controlled with minimal interfacial perturbation other than that required to quantum mechanically transition between the various heterogeneous films. Two methods for forming the epitaxial strata are described below.

METHOD 1

Figure 1:
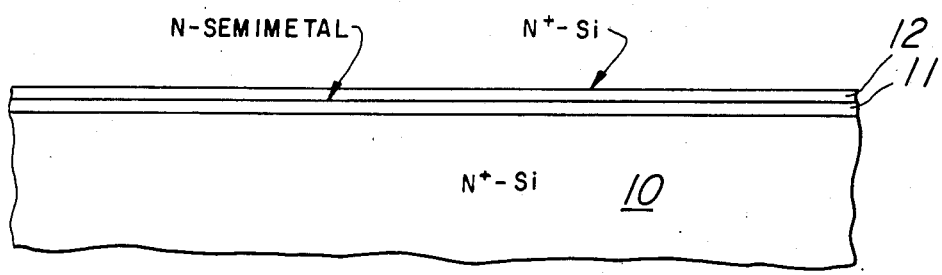
FIG. 1 is a side elevational cross-sectional view of a cascode source NPN collector boundary of an n type semimetal and n+ type silicon region.

In the first approach, with reference now to FIG. 1, a heavily donor doped monocrystalline silicon substrate 10 of <100> crystal orientation is used as the starting material. The substrate 10 is cleaned, is placed in an ultra high vacuum (UHV) silicon-based molecular beam epitaxial (MBE) reactor, and an n type semimetal layer 11 of thickness between about 0.5 and 1.0 microns is deposited on it. Although numerous techniques for forming the n type semimetal layer 11 are available, one preferred method is shown in copending patent application, Ser. No. 876,322, filed June 19, 1986, entitled SEMIMETAL-SEMICONDUCTOR CONTACT SYSTEM, by the applicant herein, said application being assigned to the assignee hereof, and incorporated herein by reference. Briefly, monocrystalline silicon is evaporated with concurrent low energy implantation of oxygen and donor impurities, such as phosphorous. The oxygen is implanted several atomic layers below the growth progression front in order to not affect the crystalline periodicity. Upon subsequent rapid thermal anneal, a sea of microcrystalline doped silicon grains with a thin layer of inter-granular silicon dioxide surrounding each grain is formed. Charge transport is by tunneling through the thin intergranular dielectric, and is controlled bythe oxygen and the donor atom concentrations. As will become apparent, the semimetal film sets the source collector boundary recombination velocity due to its oxygen and donor atom concentrations.

After the deposition of the n type semimetal layer 11, the oxygen flux is terminated in the MBE reactor, and the donor flux is altered abruptly in order to form a thin monocrystalline silicon layer 12 approximately one micron thick with an approximate donor concentration of $5 \times 10^{17}$ atoms/cm³. The monocrystalline silicon layer 12 may be counter-doped with isoelectronic germanium atoms, if desired, to controllably increase the bulk recombination rate. Together, the n type semimetal layer 11 and the n+ type monocrystalline silicon layer 12 form the cascode source NPN collector boundary, and establish its recombination velocity. The collector boundary has the electrical characteristics of controlled collector minority carrier reflection at the collector boundary independent of substrate effects and maximum majority carrier flux transmission from the wafer backside metal contact (described below). Moreover, the offset voltage of the cascode source NPN transistor which will be formed in the wafer, as described below, is controlled by controlling the relative boundary recombination velocity with respect to that of the emitter.

Figure 2:
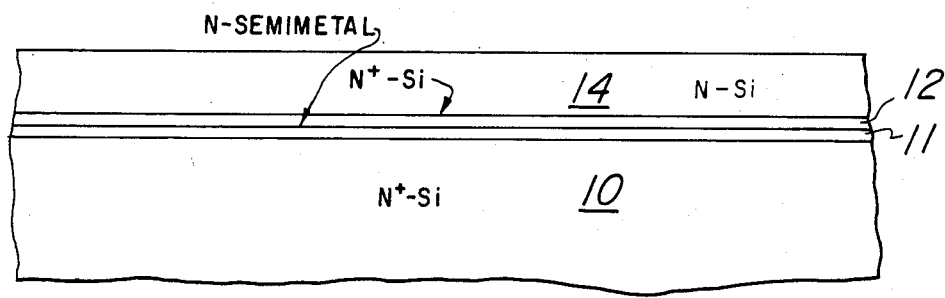
FIG. 2 is a side elevational cross-sectional view of a cascode source NPN collector blocking region formed on the boundary of FIG. 1.

After the deposition of the collector boundary, as shown in FIG. 1, the bulk collector blocking region 14 is deposited, as shown in FIG. 2. The bulk collector blocking region 14 is deposited by one of several ways. For example, the donor atom concentration can be modulated in the MBE reactor, and the film can be continuously evaporated in-situ with the boundary n type semimetal. Another way can be by low pressure epitaxial deposition. The thickness of the blocking region 14 is suggested by the desired breakdown characteristics, and can be, for example, greater than 10 microns with donor doping concentrations $1 \times 10^{15}$ atoms/cm³ or lower.

Figure 3:
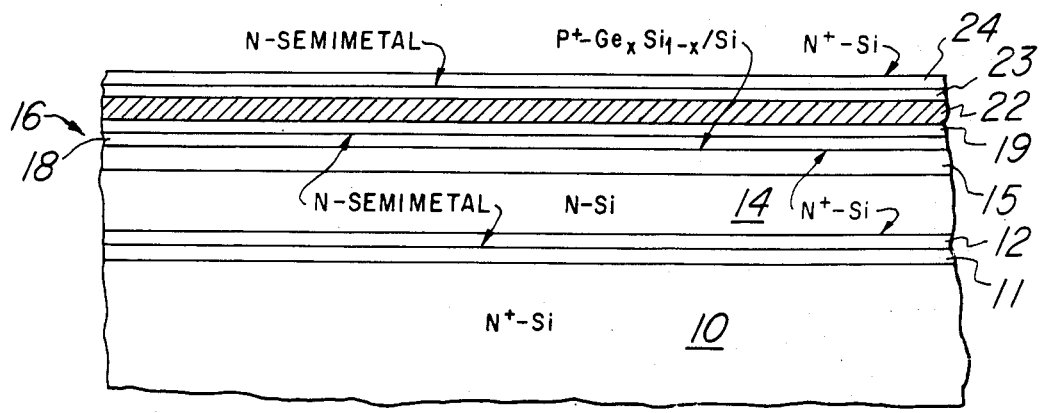
FIG. 3 is a side elevational cross-sectional view of the compositional epitaxial strata after the sink collector boundary deposition in accordance with the invention showing the abrupt termination of the monocrystalline conductor upon completion of the $NiSi_2$ evaporation, with another n type semimetal and monocrystalline silicon, forming the sink NPN collector boundary and the $I^2L$ NPN emitter boundary.

With reference now to FIG. 3, the cascode source NPN base 15 is next deposited in the UHV MBE reactor. The formation of the base 15 is accomplished, for example, by techniques described in copending patent application Ser No. 883,876, filed July 9, 1986, entitled COMPOSITIONAL DOUBLE HETEROJUNCTION TRANSISTOR, by the applicant herein, said application being assigned to the assignee hereof, and incorporated herein by reference. As described in said application, an isotype heavily acceptor doped silicon-germanium alloy/clad silicon ($Ge_xSi_{1-x}$/Si superlattice is formed by continuous evaporation with controlled low energy implantation of acceptor atoms, such as boron, to accurately set the base doping concentration. Due to the excellent sticking coefficient obtained by low energy implantation, high base doping concentrations over $10^{20}$ atoms/cm$^3$ are employed. Normally, high acceptor doping concentrations dramatically increase the bandgap energy, and therefore, the base chemostatic potential magnitude. Since a high base chemostatic potential magnitude significantly reduces the emitter injection efficiency, the base bandgap energy is reduced by employing isoelectronic germanium. Although germanium does not alter the silicon polaron concentration, which is controlled by acceptor impurity atom concentration, it does alter the exciton concentration by introducing spatially controlled midband traps. The base doping concentration is set by acceptor doping and the base chemostatic potential magnitude is independently set by the germanium concentration relative to the acceptor concentration. Due to the high lattice mismatch, approximately 4%, between silicon and germanium, superlattice techniques must be employed. The $Ge_xSi_{1-x}$ strain remains commensurate up to a certain thickness for each value of x. By controlling the $Ge_xSi_{1-x}$ thickness as a function of x and alternating the $Ge_xSi_{1-x}$ films with monocrystalline silicon films, thick superlattice structures are fabricated.

The thickness value for which the alloy relaxes decreases for increasing proportions of germanium. All strain occurs in the $Ge_xSi_{1-x}$ alloy, not in the clad silicon, with the dislocation network originating at the interface of the $Ge_xSi_{1-x}$ and clad silicon. By repetition of $Ge_xSi_{1-x}$ and Si films, each possibly several atoms thick, a strained layer superlattice up to a micron thick is formed with a substantially lower chemostatic potential magnitude than an equivalently doped silicon region. The germanium atom is isoelectronic with respect to silicon but provides recombination sites between the silicon conduction and valence bands. The effective bandgap energy and intrinsic carrier concentration are independently set with respect to the doping concentration by controlling the value of x in the $Ge_xSi_{1-x}$ alloy as well as the relative $Ge_xSi_{1-x}$ alloy and clad Si thicknesses. The base region is fabricated of sub-micron thickness. Since the base region is highly acceptor doped, it is virtually immune from etching by anisotropic silicon etchants, such as propanol diluted potassium hydroxide. Consequently, a contact is made easily to a thin base region by means of anisotropic silicon etching techniques. The doped, compositional hybrid superlattice base proposed in this invention allows independent control of polaron concentration and bandgap energy, and therefore, electrochemical potential magnitude.

With reference still to FIG. 3, it is desirable to form the emitter region with a wide bandgap energy and a low recombination velocity to minimize minority carrier diffusion, and also, with sufficient control, to set the divergence of emitter and base mobile carrier velocities. To effect this, a two zone emitter 16 is employed, and is constructed like the collector boundary 11 and 12. The composite emitter 16 has a substantially monocrystalline film 18 with the proper donor concentration immediately adjacent to the base region 15, and has an overlying n type semimetal film 19 terminating it. The composite emitter 16 is thus fabricated with a chemostatic potential magnitude much greater than that of the base region to favor electron injection into the base, with a favored transmission of electrons from the emitter contact by a drift field, and with a high reflection of holes injected into the emitter from the base. These phenomena cause the bias controlled junction currents to be dominated by space charge recombination effects due to large divergence of emitter and base mobile carrier velocities. These effects are then adjusted to obtain the desired cut-in voltage, roll-off voltage, and peak gain operating point by appropriately increasing the emitter recombination velocity. The emitter boundary recombination velocity is increased by adjusting the semimetal donor and oxygen concentrations to vary the emitter semimetal isotype Schottky barrier height. Another way to increase the emitter recombination velocity is by counter-doping the emitter monocrystalline region with germanium during silicon evaporation in the UHV MBE reactor. The isoelectronic germanium atoms effectively increase the silicon midband traps, which is augmented by the compressive stress associated with the larger germanium atom in the silicon lattice. The germanium atoms are fully activated with the donor atoms by means of rapid thermal annealing. This has the effect of raising the intrinsic carrier concentration.

The cascode source NPN emitter n type semimetal boundary 19 is contacted by a $NiSi_2$ monocrystalline conductor layer 22. It will be appreciated that a monocrystalline conductor layer of $CoSi_2$ or other appropriate silicide can be equally advantageously employed. The monocrystalline conductor layer 22 is fabricated in the UHV MBE apparatus immediately following the deposition of the n type semimetal layer 29 by abruptly ceasing oxygen and donor implantation and abruptly commencing the concurrent nickel and silicon coevaporation. The $NiSi_2$ monocrystalline film 22 provides low impedence unipolar electrical contact to the n type semimetal layer 19, the impedance being controllable by varying the $NiSi_2$ thickness. The $NiSi_2$ thickness is made microns thick by superlattice techniques. Upon completion of the $NiSi_2$ evaporation, the monocrystalline conductor is abruptly terminated and another n type semimetal layer 23 is immediately deposited, followed by a deposition of a monocrystalline silicon region 24. This is identical, but in reverse order, to the source NPN emitter boundary structure. It forms the sink NPN collector boundary and the $I^2L$ NPN emitter boundary.

Figure 4:
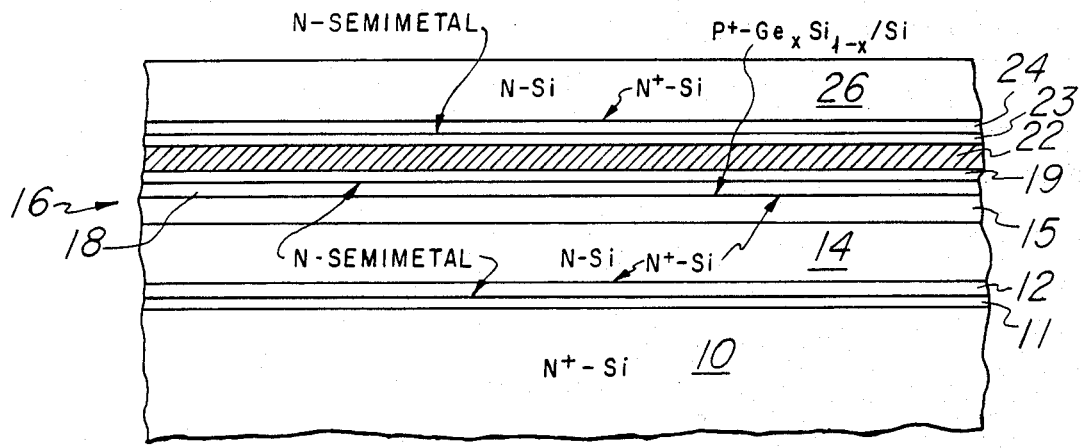
FIG. 4 is a side elevational cross-sectional view of the epitaxial strata after cascode sink NPN blocking region deposition, particularly showing the NPN sink monocrystalline collector.

As shown in FIG. 4, the cascode sink collector blocking region is epitaxially grown or deposited in the UHV MBE apparatus or by low pressure chemical vapor deposition techniques. The blocking region concentration is donor doped with donor concentrations of approximately $1\times10^{14}$ atom/cm$^3$ to $5\times10^{15}$ atom/cm$^3$, depending on the desired blocking voltage. Similarly, the blocking region thickness is determined by the application characteristics, for example between about 10 to 15 microns thick for small motor applications.

Figure 5:
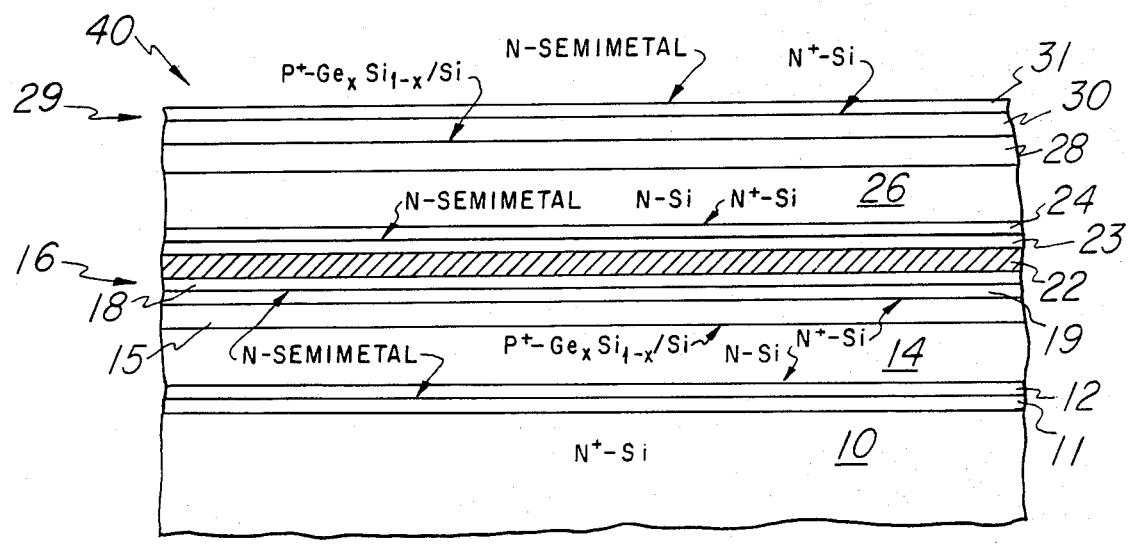
FIG. 5 is a side elevational cross-sectional view of the completed epitaxial strata, in accordance with the invention.

With reference now to FIG. 5, the cascode sink NPN base 28 and emitter 29 are deposited similar manner to those of the cascode source NPN base 15 and emitter 16, that is, p$^+$ type $Ge_xSi_{1-x}$/Si superlattice for the base 28 and a compositional emitter 29 comprising a monocrystalline donor doped silicon region 30, possibly with germanium counter-doping, and an n type semimetal boundary 31. The films 28 and 29 are grown as before in the UHV MBE apparatus with film characteristics similar to those described with respect to the cascode source NPN base 15 and emitter 16. Thus, a resulting wafer 40 is produced in which the devices are fabricated, as below described in detail.

It will be appreciated that the above described method for fabricating the various layers of the epitaxial strata described focused on a non-compensated wafer fabrication technique comprised of the marriage of UHV silicon-based MBE and low energy ion implantation along with low pressure chemical vapor deposition. The entire fabrication process is carried out sequentially under computer control in a vacuum to minimize interfacial perturbations. In this manner, selectively doped moncrystalline silicon with germanium counterdoping are grown in the same apparatus with monocrystalline conductors, semimetals, and $Ge_xSi_{1-x}$/Si superlattices. This is done with virtually atomic control of the lattice and at low temperatures to minimize perturbation of the resultant hyperabrupt junctions.

Another method for fabricating the epitaxial strata uses a fundamentally different approach utilizing the fusion of two wafers.

METHOD 2

Thick buried conductors are employed to allow low ohmic drops at high current levels without periodicity perturbation of the crystalline regions on either side of the crystalline conductor by utilizing wafer fusion at the buried conductor boundary. This technique is described in copending patent application Ser. No. 893,437, filed Aug. 1, 1986, entitled WAFER FUSED BURIED CONDUCTORS, by the applicant herein, said application being assigned to the assignee hereof, and incorporated herein by reference. In accordance with said copending application the guest and host wafers are prepared separately and fused together.

Figure 6:
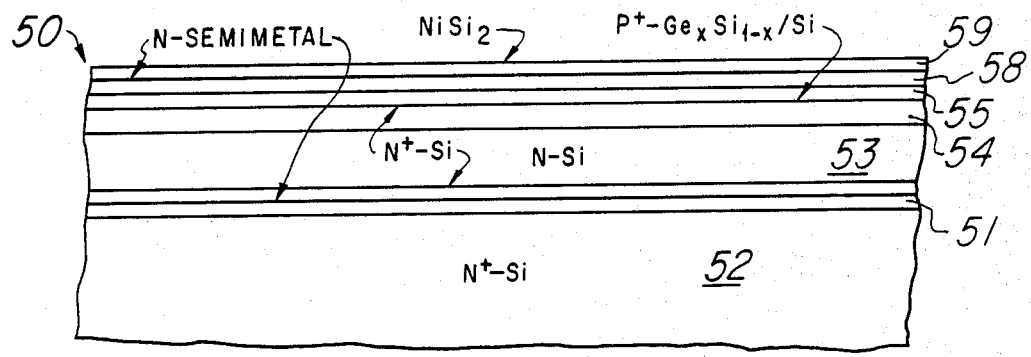
FIG. 6 is a side elevational cross-sectional view of the host wafer, showing the cascode source NPN transistor, in accordance with the invention.

Thus, with reference now to FIG. 6, a cascode source NPN transistor is formed in a host wafer 50. The collector n type semimetal layer 51 is formed on the n+ type silicon substrate 52 in the manner previously described, or by oxygen implantation of an already deposited monocrystalline region. The monocrystalline collector region 53 is fabricated by low pressure chemical vapor deposition. The base region 54 is a p+ type $Ge_xSi_{1-x}$/Si superlattice or a heavily acceptor doped, germanium counter-doped silicon epitaxial region deposited by conventional low pressure chemical vapor deposition techniques for applications in which high performance is not required. The emitter region 55 is fabricated as before or by providing a monocrystalline silicon region terminated with a subsequent oxygen implantation in order to form the n type semimetal layer 58. A layer of pure nickel is then evaporated on the n type semimetal layer 58, converted to a layer 59 monocrystalline $NiSi_2$, and subsequently annealed.

Figure 7:
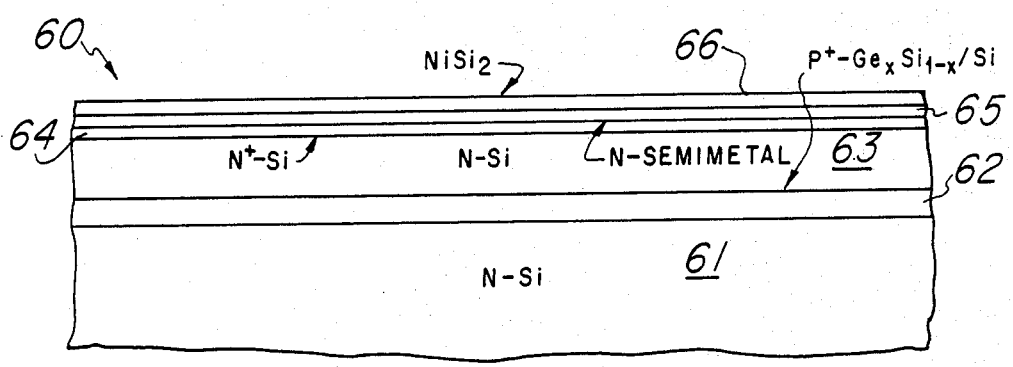
FIG. 7 is a side elevational cross-sectional view of the guest wafer, showing the cascode sink NPN transistor, in accordance with the invention.

With reference to FIG. 7, a guest wafer 60 is prepared in a manner similkar to that of the host wafer 50. The guest wafer 60 is processed on a low resistivity donor doped monocrystalline silicon substrate 61 of <100> crystal orientation, substantially the same as that of the host wafer 50. A hybrid p+ type $Ge_xSi_{1-x}$/Si superlattice 62 is deposited as before, or for lower performance applications a heavily acceptor doped silicon monocrystalline region with germanium counter-doping can be formed, such as by low pressure chemical vapor deposition. A monocrystalline silicon region 63 with an overlying layer of n+ silicon 64 are epitaxially deposited and terminated by an n type semimetal layer 65. Finally, a layer 66 of nickel is deposited over the n type semimetal layer 65, and converted to a monocrystalline $NiSi_2$ layer 66 by a subsequent anneal step.

Nature desires to seek the highest bound particle state available in order to minimize the potential energy. This generally occurs in many solids with covalent bonding of atoms which results in a periodic crystal for minimal degrees of freedom (low entropy). The optimal termination of a periodic bound particle system in one direction is by means of a bound particle system of identical periodicity in the other direction with sufficient activation energy to allow covalent bonding of exposed termination bond orbitals. This presumes that all non-crystalline guest and host bonds are free and not tied up with extraneous atoms.

Figure 8:
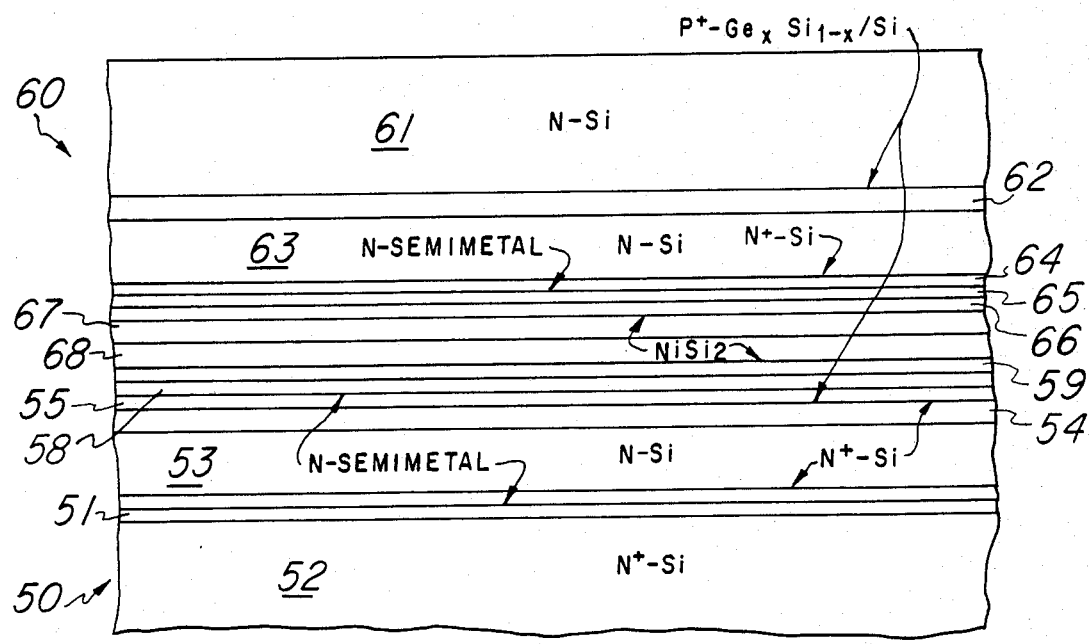
FIG. 8 is a side elevational cross-sectional view of the guest and host wafers of FIGS. 6 and 7, prior to fusion.
Figure 9:
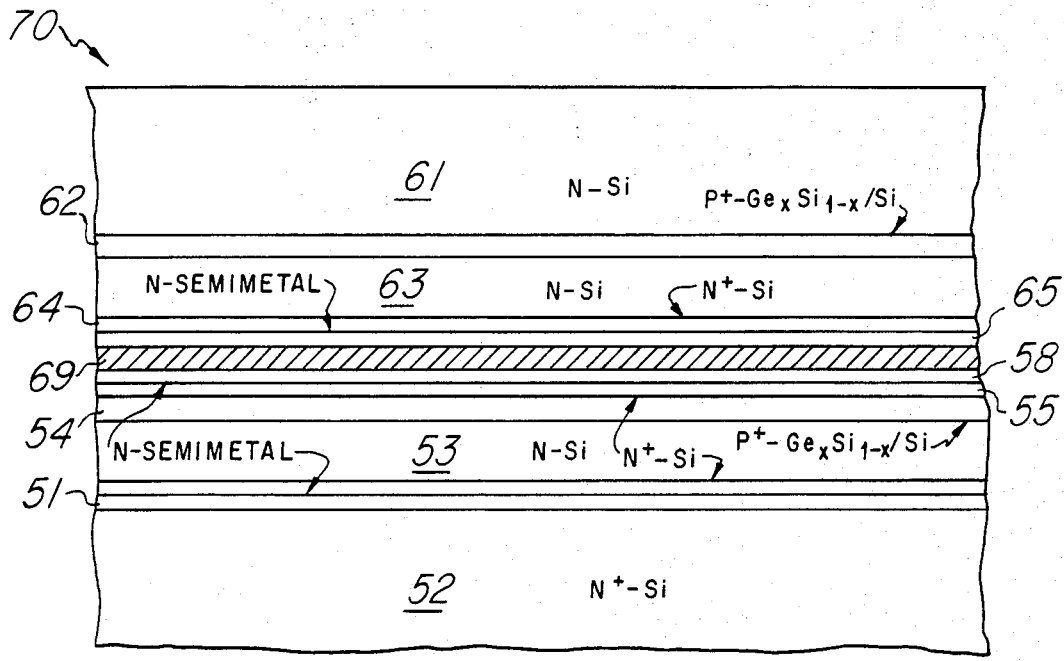
FIG. 9 is a side elevational cross-sectional view of the guest and host wafers of FIG. 8, after fusion.

Accordingly, the guest and host wafers 50 and 60 are positioned face to face, in intimate contact, as shown in FIG. 8. The fusion of the two wafers, being of nearly identical periodicity, is then accomplished by exposing them to an elevated temperature in an inert ambient. The thin native oxide layers 67 and 68 are broken up and the excess oxygen diffuse into the host and guest lattices leaving exposed bond orbitals. Thermal energy allows proper covalent bonds to be formed between the lattice atoms of the host and guest crystals 50 and 60 in order to minimize the interfacial potential energy barrier, to form an essentially continuous $NiSi_2$ layer 69, as in a fused structure 70, shown in FIG. 9. Although fusion can be carried out in a furnace, best results are obtained by means of rapid thermal annealing, for example, by a halogen lamp anneal, in order that the bond orbitals are exposed and joined without significant diffusion or any concurrent oxidation effects. Fusion is accomplished for example at a temperature of about 1000° C. at a time, for instance of about 60 seconds.

Fused waters with excellent mechanical bond strength result from a high, although not necessarily ideal, periodicity at the fusion interface. Minority carrier characteristics of the fused junction are heavily affected by any non-periodic effects. However, since the fused surface is a conductor, unipolar charge transport is desired. Consequently, any deviations from ideal periodicity serve to retard deleterious minority carrier effects. Therefore, fusion of unipolar conductors is desirable due to forgiveness of deviation from perfect periodicity at the fusion interface.

Figure 10:
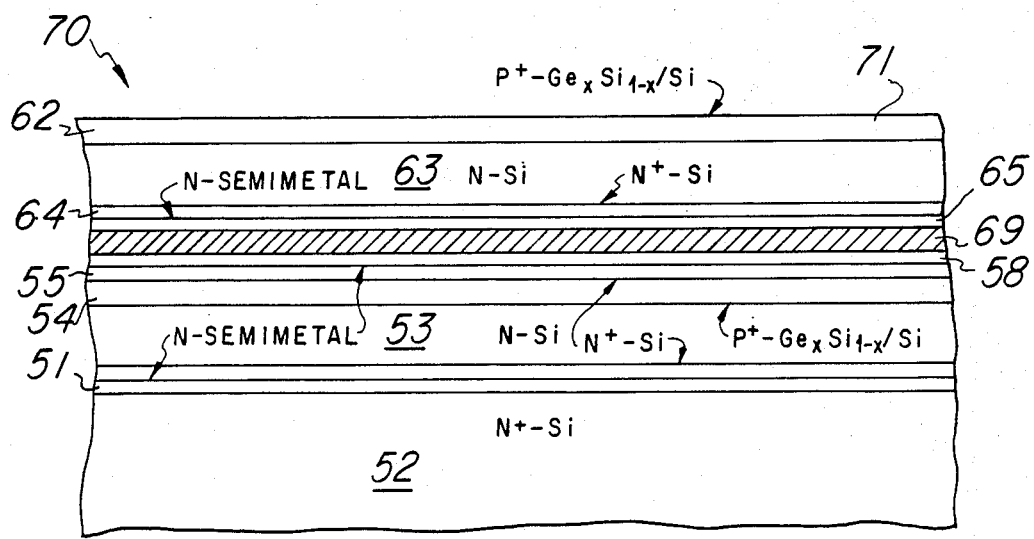
FIG. 10 is a side elevational cross-sectional view of the fused construction of FIG. 9, after etch back.

After fusion, the guest portion 60 of the fused water 70 is mechanically lapped back to near the substrate-superlattice junction 71 and then chemically etched, as shown in FIG. 10. Although numerous chemicals can be employed, an anisotropic silicon etchant, such as propanol diluted potassium hydroxide is a preferred etchant. With this type of etchant at a temperature of about 85° C., the lightly doped guest wafer region 61 etches rapidly, approximately one micron per minute, while the heavily acceptor doped region 62 is virtually immune to etching.

Figure 11:
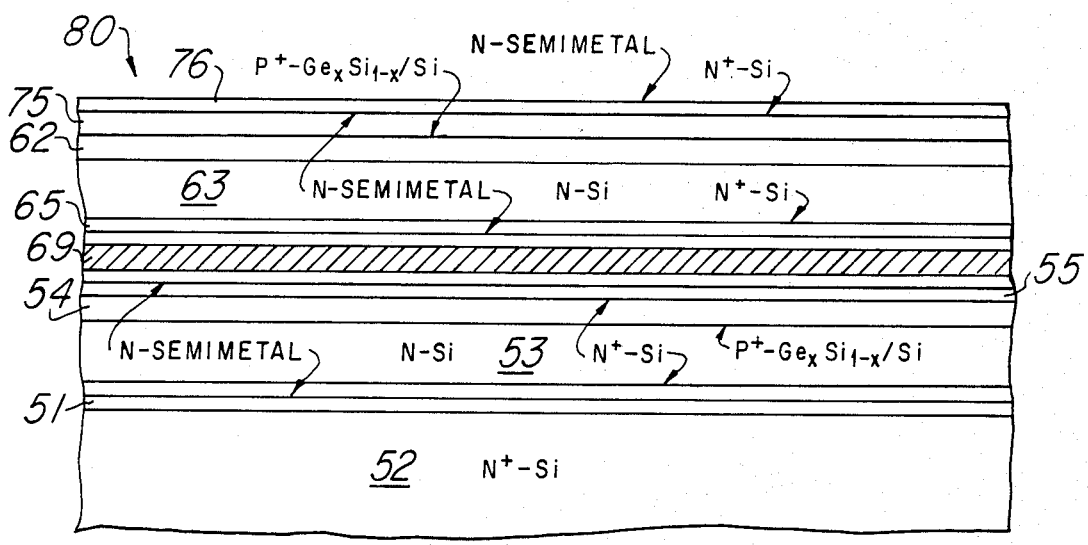
FIG. 11 is a side elevational cross-sectional view of the completed epitaxial strata in accordance with the invention.

Following etchback a compositional emitter 75 is epitaxially grown, and a layer of n type semimetal 76 is formed thereover, as shown in FIG. 11. The resultant epitaxial strata 80 shown in FIG. 11 is identical to that of the epitaxial strata FIG. 5.

FABRICATING THE CIRCUITS AND DEVICES

Upon completion of the epitaxial strata, the active device parameters are set. As mentioned, in the fabrication of the epitaxial strata 40 or 80, epitaxial growth is performed so that the various films are atomically controlled with minimal interfacial perturbation other than that required to quantum mechanically transition between the heterogeneous films. Thus, epitaxial processing is carried out at low temperatures, below 700° C., to preclude thermal diffusion or perturbation of the hyperabrupt junctions. After the epitaxial growth, the wafer is subjected to a brief rapid thermal anneal, such as at a temperature of about 1000° C. for a time of about 60 seconds, to fully activate the dopants and to restructure the semimetal grain structure. This anneal is sufficiently short in duration to preclude diffusion.

Upon annealing, the oxygen in the semimetal tends to segregate out since it is well above the solid solubility in silicon. Since the Si-O bond is favored over the Si-Si bond, monocrystalline silicon grains are formed in a sea of $SiO_2$ with a surrounding Si-O bond that maximizes the granular surface area. Higher annealing temperatures form larger silicon grains with thicker intergranular dielectric. Upon annealing, the total oxygen and silicon concentrations remain constant, but the grain structure is modified. The degree of grain growth upon subsequent annealing is heavily dependent upon the as-deposited growth conditions. Donor doping of the microcrystalline silicon grains increases the oxygen solid solubility in the microcrystalline grains, which results in smaller grains with a thinner intergranular silicon dioxide.

The traps in the intergranular dielectric with energies near midband tend to deplete the small microcrystalline silicon grains. The intergranular oxide barrier varies between 2 Å to 10 Å, depending on the film oxygen and donor concentrations, and depletion of the grains forces the Fermi level to be near the midband energy and the grains to act like intrinsic crystals. Since conduction occurs by tunneling through the oxide barrier, the intergranular oxide barrier controls the conduction characteristics. Thus, the oxygen concentration and the solid solubility of oxygen in the microcrystalline grains controls the intergranular oxide barrier, and thereby, the film conductivity. As a result, the oxygen and donor doped microcrystalline silicon film is semi-insulating for high oxygen, low doping concentrations and semi-conducting for low oxygen, high doping concentrations.

As mentioned, the epitaxial strata is carefully grown in a non-compensated manner to maintain crystalline perfection. Device delineation can therefore be realized with an anisotropic etch, such as with propanol diluted potassium hydroxide, which etches monocrystalline silicon rapidly in the <100> direction. However, semimetals are resistive to anisotropic etching due to their oxygen content, and p+ type $Ge_xSi_{1-x}$/Si superlattices are also impervious to anisotropic etching due to their high trivalent atom concentrations. Since both these materials are readily etched by appropriate plasma gases, such as $Cf_4$, they are employed as selective anisotropic etch masks.

Thus, in performing device delineation with propanol diluted potassium hydroxide, an exposed monocrystalline region is masked and rapidly etched (about 1 micron/minute at about 85° C.) in the <100> direction. When a <111> plane is exposed, the etching dramatically retards itself in the direction of the <111> plane. As a result, etching proceeds along the <111> crystallographic planes with virtually no undercutting. When two <111> planes intersect, the anisotropic etching essentially ceases; consequently, a V-groove is formed having a depth which is accurately controlled by the size of the aperture of the semimetal or superlattice etch mask. Thus, any combination of etch depths can be simultaneously achieved with minimal process control. In this manner, any region or layer of the epitaxial strata can be controllably exposed within a V-groove, and at the same time the crystalline perfection of the non-compensated periodic lattice can be preserved.

In the fabrication of devices on the wafers described above, it will be assumed, for convenience that a wafer 40 fabricated in accordance with METHOD 1 above will be employed. Thus, in the formation of a the structure having sub-micron p+ type $Ge_xSi_{1-x}$/Si superlattice base regions, three successive anisotropic etches are necessary, etches to expose: a cascode sink NPN base contact to the layer 28, a cascode NPN output contact to the layer 22, and a cascode source NPN base contact to the layer 15.

Figure 12:
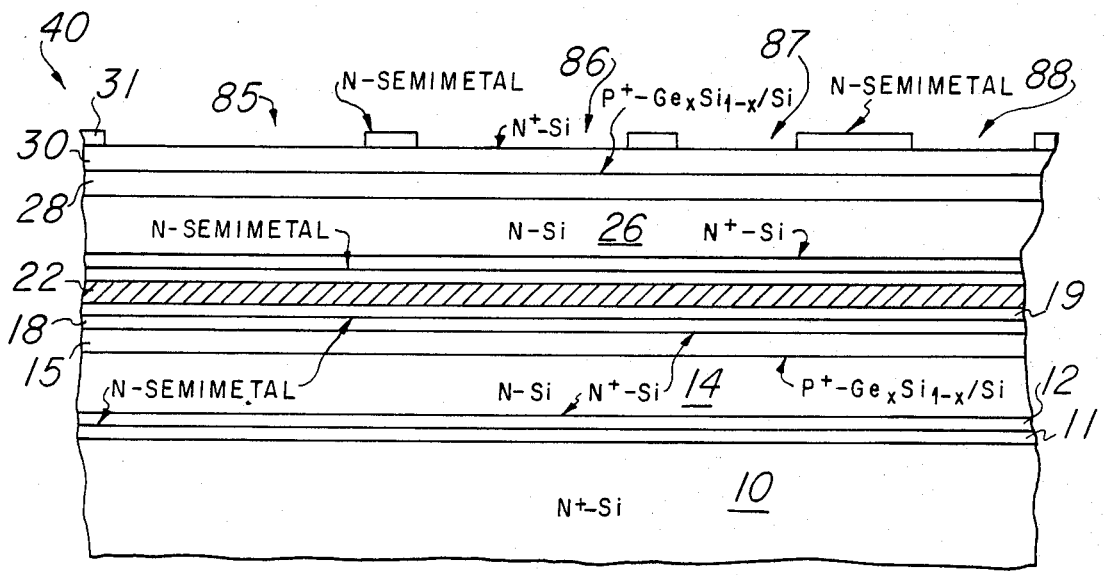
FIG. 12 is a side elevational cross-sectional view of a structure illustrating the initial delineation etch mask in the formation of devices in accordance with the invention.

For the first delineation etch, photoresist (not shown) is deposited, patterned, and developed by known lithographic technique to expose regions of the n type semimetal layer 31 beneath which anisotropic etching of the monocrystalline silicon layer 30 is desired. The n type semimetal layer 31 is then selectively etched in a plasma gas, such as $CF_4$. After the photoresist is removed an etch mask is formed, as shown in FIG. 12, having openings 85, 86, 87, and 88, for example, for use in forming a structure containing half H-bridge circuitry, as below described. Similar etch masks can be formed, as will be apparent to those skilled in the art to form other circuitry, such as $I^2L$ gate and bipolar transistor circuitry (mask not shown), below described in detail.

Figure 13:
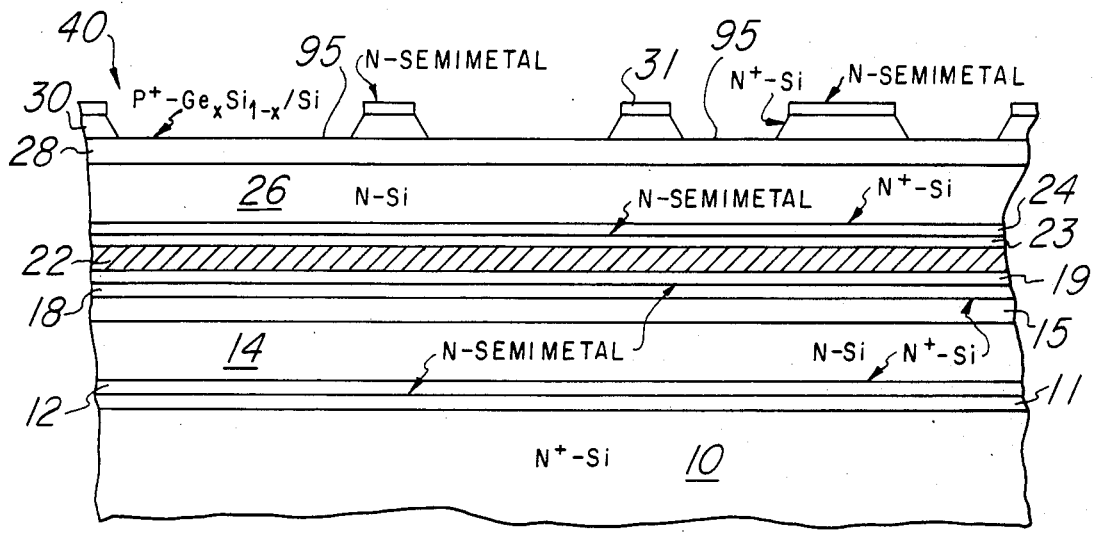
FIG. 13 is a side elevational cross-sectional view of a structure resulting from a patterned etch of an half H-bridge circuit in accordance with the invention.
Figure 14:
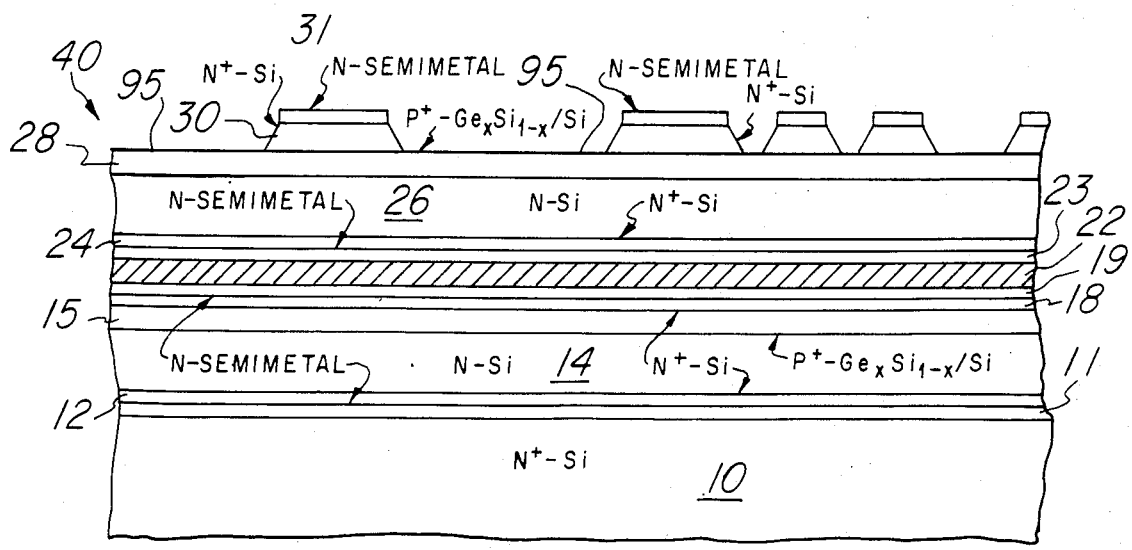
FIG. 14 is a side elevational cross-sectional view of a $I^2L$ gate and bipolar transistor formed in accordance with the invention.

The wafer is then anisotropically etched in propanol diluted potassium hydroxide at a temperature of about 85° C. for a time between about 1 to 2 minutes, until the <100> etch front reaches the surface 95 of the p+ type $Ge_xSi_{1-x}$/Si superlattice, at which point, the etching essentially self stops. The resultant patterned etch of a half H-bridge is shown in FIG. 13 and of an $I^2L$ gate and bipolar transistor in FIG. 14.

The second delineation etch mask is selectively patterned by applying photoresist (not shown) and developing it over regions of p+ type $Ge_xSi_{1-x}$/Si superlattice. Although numerous exposure techniques can be utilized, it is believed that masked ion beam photoresist exposure, such as by protons, is particular suitable. Proton beams produce highly collimated beams that remain parallel over a proximity of hundreds of microns, and impart most of their energy in the resist and are efficient in exposing it. Masked ion beam lithography allows sub-micron patterning of the resist over extremely nonplanar regions without dispersion or reflection effects, and is cost effective in production.

Figure 15:
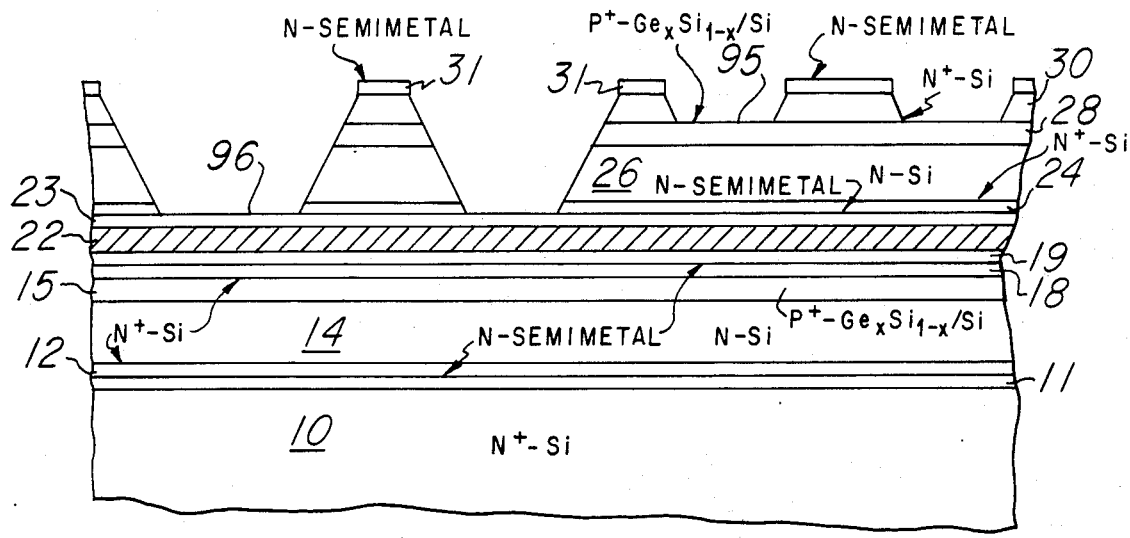
FIG. 15 is a side elevational cross-sectional view of the resultant of a patterned anisotropic etch of a half H-bridge which proceeds along crystallographic etch fronts until the next n type semimetal is exposed and anisotropic etching ceases.
Figure 16:
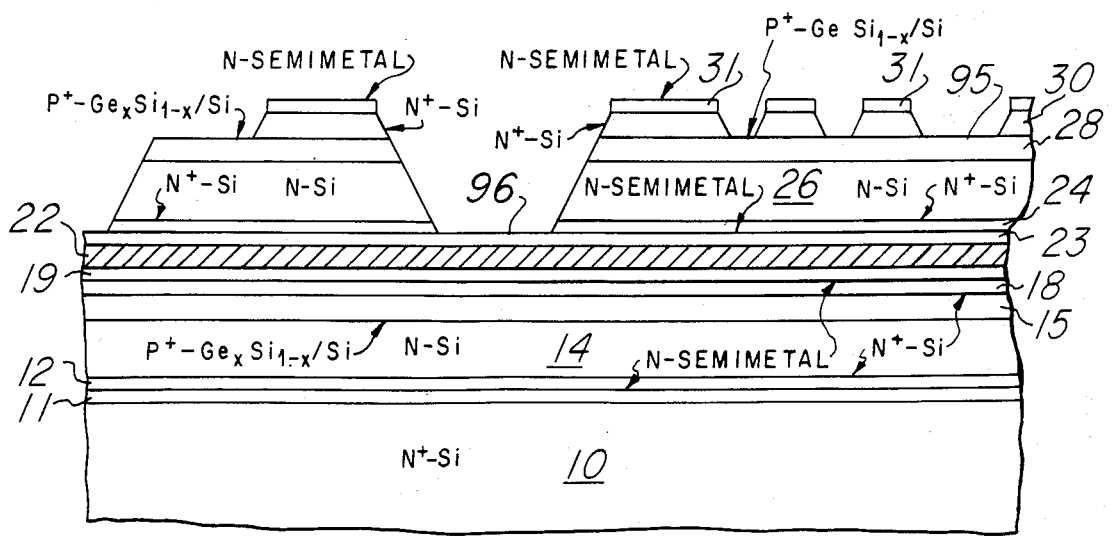
FIG. 16 is a side elevational cross-sectional view of an non-planar $I^2L$ gate and bipolar transistor, in accordance with the invention.

After the resist is exposed, the p+ type $Ge_xSi_{1-x}$/Si superlattice is etched in a plasma gas such as $CF_4$. The resist is removed and the wafer is again subjected to an anisotropic etch such as propanol diluted potassium hydroxide. Only those regions where the p+ type $Ge_xSi_{1-x}$/Si superlattice is removed will have exposed monocrystalline regions that are subject to anisotropic etching; all other regions are blocked by a semimetal or a superlattice. Anisotropic etching will proceed along crystallographic etch fronts until the surface 96 of the next n type semimetal is exposed whereupon the anisotropic etching essentially ceases. The resultant patterned etch of a half H-bridge is shown in FIG. 15 and of an I²L gate and bipolar transistor in FIG. 16. As can be seen particularly in FIG. 16, non-planar structures are formed.

Figure 17:
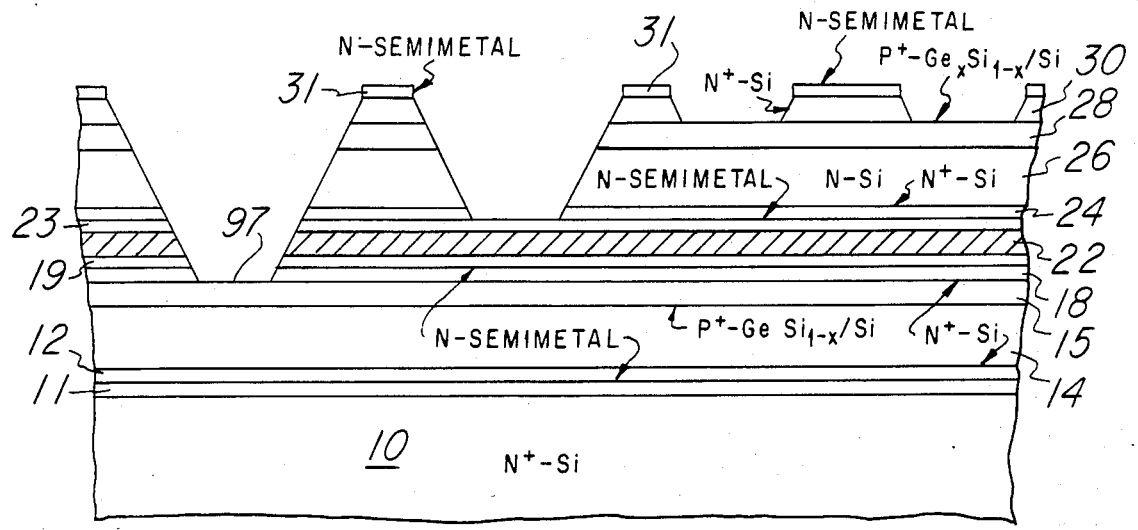
FIG. 17 is a side elevational cross-sectional view of an a half H-bridge sandwich which has been selectively etched in a plasma gas to remove the intervening $NiSi_2$ with the plasma etching stopping in the monocrystalline n+ type silicon, and after anisotropic etching to expose regions terminating on the lower p+ type $Ge_xSi_{1-x}/Si$ superlattice.
Figure 18:
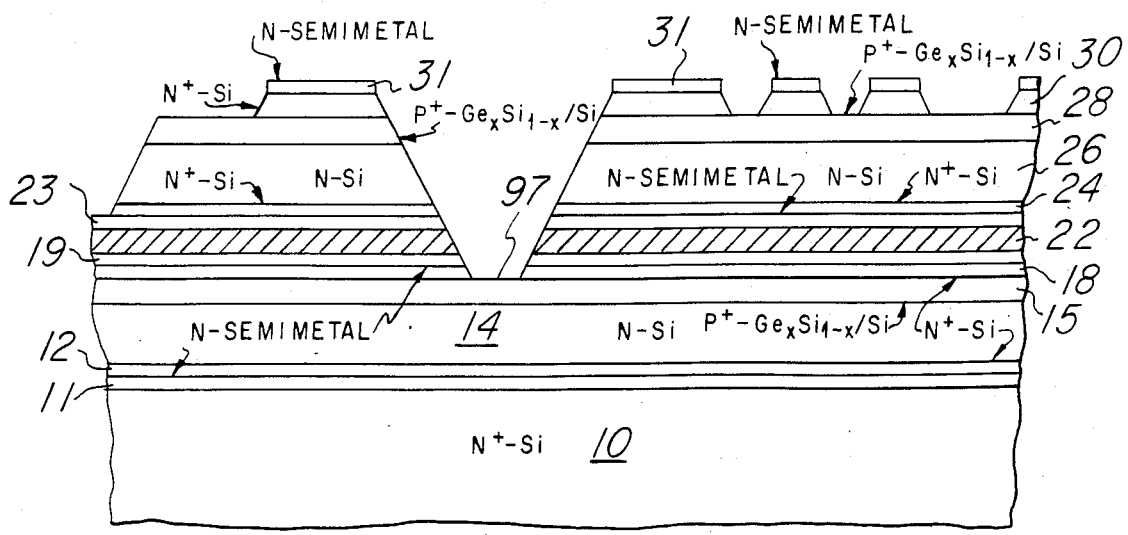
FIG. 18 is a side elevational cross-sectional view of an a $I^2L$ and bipolar transistor which has been selectively etched in a plasma gas to remove the intervening $NiSi_2$ with the plasma etching stopping in the monocrystalline n+ type silicon, and after anisotropic etching to expose regions terminating on the lower p+ type $Ge_xSi_{1-x}/Si$ superlattice.

Finally, resist (not shown) is once again conformally deposited, for example, by LPCVD or spray techniques, and exposed, such as by masked ion beam lithography. The resist is developed in regions where it is desired to remove the underlying n type semimetal/-NiSi₂/n type semimetal sandwich to form a selective mask for the third delineation etch. The sandwich is selectively etched in a plasma gas, such as CF₄, with the plasma etching stopping the moncrystalline n⁺ type silicon. Again anisotropic etching is performed with the etching stopping when the exposed regions terminate on the surface 97 of the lower p⁺ type $Ge_xSi_{1-x}$/Si superlattice. This is illustrated in FIG. 17 for a half H-bridge and in FIG. 18 for an I²L gate and bipolar transistor to complete the component delineation.

Figure 19:
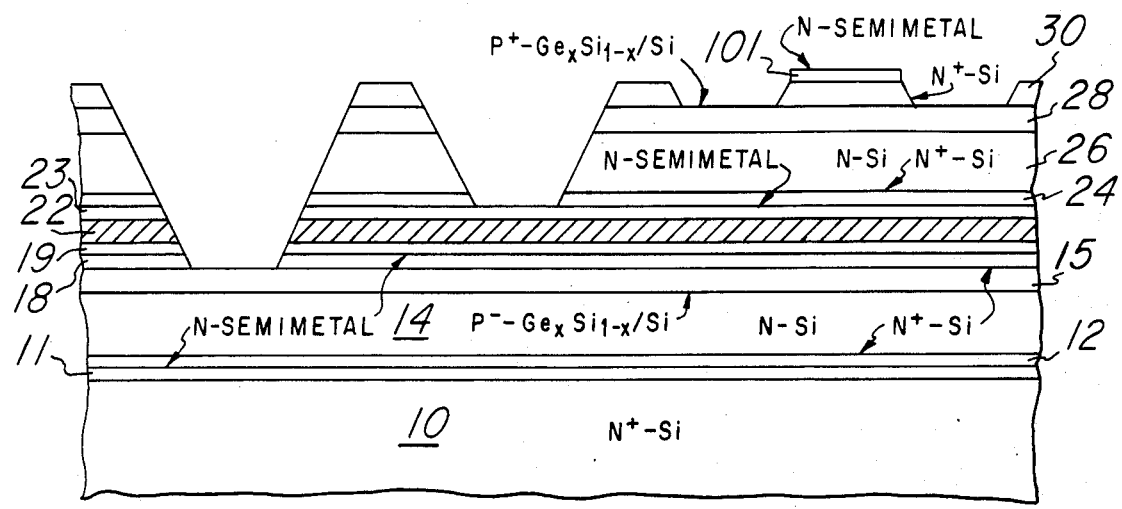
FIG. 19 is a side elevational cross-sectional view of an n type semimetal termination of a half H-bridge by applying a conformal resist with appropriate exposure and development followed by a plasma etch.
Figure 20:
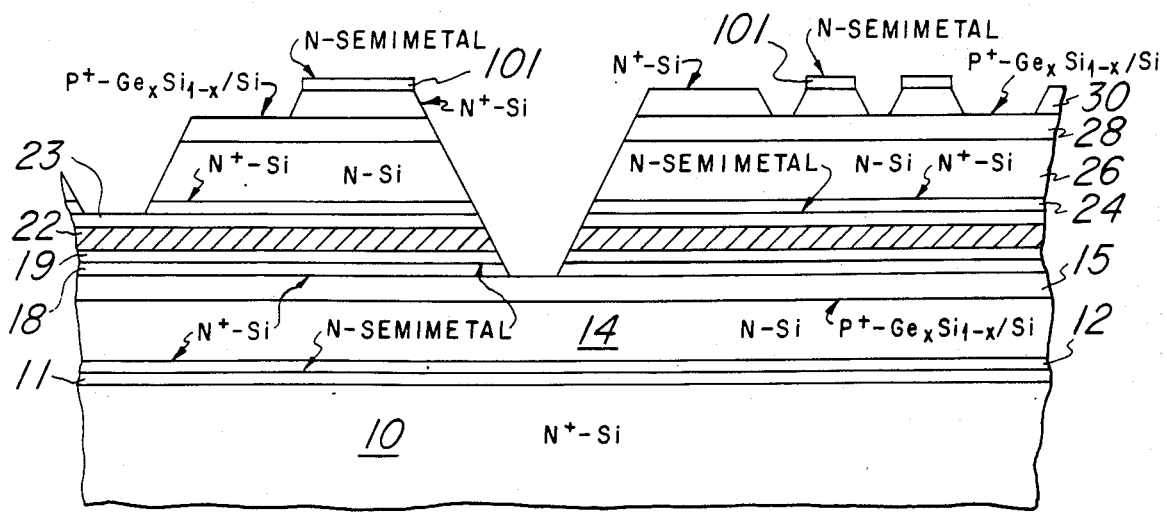
FIG. 20 is a side elevational cross-sectional view of an n type semimetal termination of an $I^2L$ gate and bipolar transistor by applying a conformal resist with appropriate exposure and development followed by a plasma etch.

The delineation steps are followed by successive terminations of the monocrystalline regions. Three types of monocrystalline lattice termination are used: n type semimetal, p type semimetal, and semi-insulating film. Termination of the appropriate monocrystalline region by an n semimetal is achieved by selectively removing any undesired n type semimetal. This is accomplished by applying a conformal resist (not shown) with appropriate exposure and development followed by a plasma etch. The n type semimetal termination 101 of a half H-bridge is shown in FIG. 19 and of an I²L gate and bipolar transistor in FIG. 20.

After n type semimetal patterning, the resist is stripped and a p type semimetal is deposited. In order to eventually obtain etch selectively between the semimetals, an intermediate film (not shown) is generally required. One preferred technique is to employ an intermediate undoped monocrystalline or polycrystalline silicon film, which may easily be obtained by evaporating silicon and shuttering the oxygen and dopants in the MBE after n type semimetal deposition. In order to obtain self-alignment to the n type semimetal, the undoped film should be deposited prior to n type semimetal patterning. An overlying thin oxide may be deposited by low temperature, low pressure chemical vapor deposition and subsequently densified by rapid thermal anneal. The n type semimetal is then etched with a three step process. The oxide is plasma etched with the patterned resist as the etch mask, and the undoped silicon is etched with propanol diluted potassium hydroxide which has a high etch rate in undoped silicon and a negligible etch rate in n type semimetal. The n type semimetal is then plasma etched with minimal plasma etching of the undoped silicon. A built-in etch selectivity is established since the undoped silicon acts as an etch mask to a dry plasma gas, such as CF₄, which readily etches the n type semimetal while the n type semimetal acts as an etch mask to a wet potassium hydroxide solution which readily etches the undoped silicon. In this manner all exposed n type semimetal surfaces of FIG. 19 and 20 actually may have a self-aligned undoped silicon and oxide overcoat (not shown).

The p type semimetal can be deposited by a number of techniques. One method is by the pyrolysis of a silicon such as silane in the presence of an oxygen source such as nitrous oxide and a dopant gas such as diborane in a low pressure chemical vapor deposition reaction. The reaction is carried out in a vacuum at approximately 600°–650° C. with computer control of the gas flow rates. The oxygen and dopant concentrations are varied by the relative nitrous oxide and diborane flow rates. In this manner, the desired chemostatic potential and conductivity is achieved by design by controlling the microcrystalline grain structure and the intergranular oxide. After completion of p type semimetal deposition, the nitrous oxide and diborane flow rates are stopped and a thin layer of undoped polysilicon is deposited by the pyrolysis of silane which, when accompanied by a thin overlaying oxide, provides the desired etch selectivity in a subsequent patterning.

Figure 21:
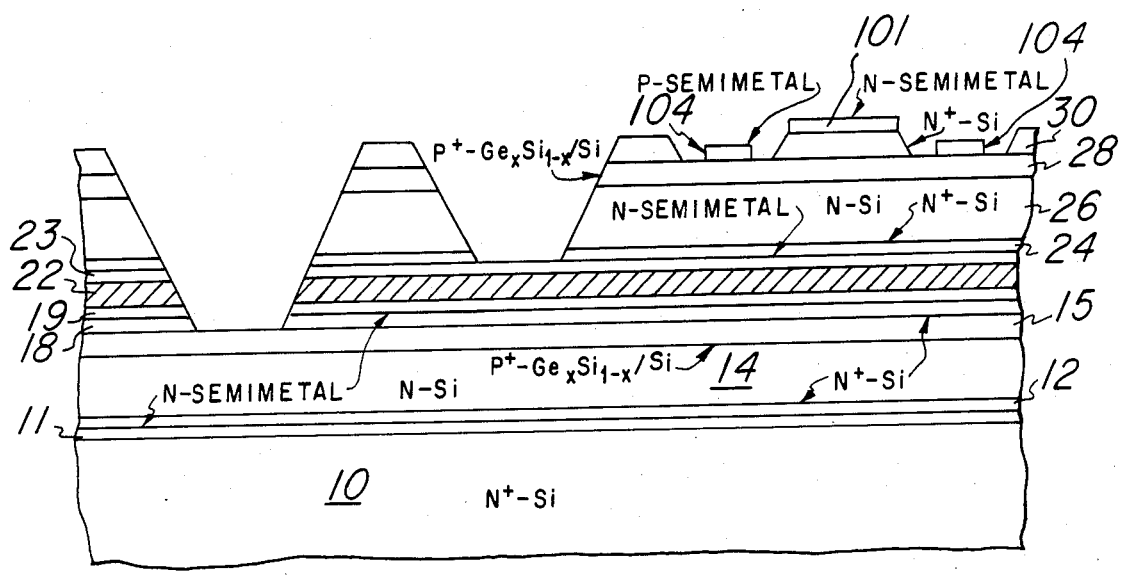
FIG. 21 is a side elevational cross-sectional view of an p type semimetal termination of an half H-bridge with an oxide patterned with an masked ion beam lithography followed by a wet and dry etches.
Figure 22:
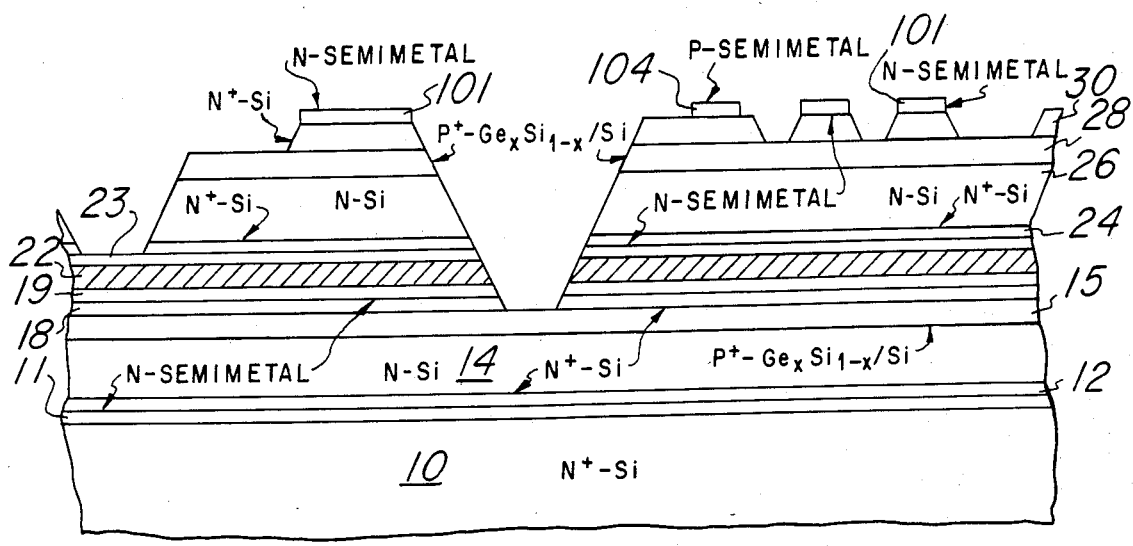
FIG. 22 is a side elevational cross-sectional view of an p type semimetal termination of an I²L gate and bipolar transistor with an oxide patterned with an masked ion beam lithography followed by a wet and dry etches.

Alternately, the p type semimetal could be deposited by molecular deposition techniques similar to the n type semimetal. Specifically, silicon is evaporated in a UHV environment with concurrent low energy implantation of oxygen and boron. Again the proper film characteristics are realized by controlling the relative implantation doses. Upon completion of p type semimetal deposition, implantation ceases and a thin undoped monocrystalline silicon film is evaporated to provide the etch selectivity. In any event the p type semimetal is deposited and an overlying resist is patterned with an appropriate method such as masked ion beam lithography. The thin oxide is etched with the patterned resist serving as the mask, followed by a wet etch of the undoped silicon with a chemical such as propanol diluted potassium hydroxide, which essentially stops in the p type semimetal, with the patterned oxide serving as a mask. The wafer is then etched in a dry plasma gas such as CF₄ which rapidly etches the p type semimetal but is retarded in the undoped silicon overlying the n type semimetal. In this manner the p type semimetal 104 is deposited and patterned as shown in FIG. 21 for a half H-bridge and in FIG. 22 and for an I²L gate and a bipolar transistor.

After p type semimetal patterning an inorganic passivation is applied to terminate and to passivate all monocrystalline regions except those to be directly contacted by a metal. It is believed that a SIPONT film is particularly well suited, such film being constructed in accordance with U.S. patent application Ser. No. 847,357, filed Apr. 2, 1986, entitled MULTILAYER SEMI-INSULATING FILM FOR HERMETIC WAFER PASSIVATION AND METHOD FOR MAKING SAME, coinvented by the applicant herein and another, said application being assigned to the assignee hereof, and incorporated herein by reference.

Briefly, the wafer is exposed to a dilute hydrofluoric acid deglaze to remove any chemical or native oxides. A layer of amorphous silicon between about 100 Å and 200 Å thick is deposited by the pyrolysis of monosilane in a LPCVD reactor. Then, a layer of oxygen doped polycrystalline silicon about 2500 Å thick is blended with the amorphous silicon, by blending the reactant gases. Since the monocrystalline grains are undoped, they are intrinsic with a low solid solubility of oxygen. Consequently, the intergranular dielectric is relatively thick and tunneling is impeded. This establishes the semi-insulating properties and the surface Fermi level of the monocrystalline region. A film of about 1000 Å comprising an oxynitride film with an overlying nitride film is then deposited to seal the surface from the external ambient, oxygen and moisture. A primary seal is provided by the silicon nitride, and a stress relief between the silicon nitride and the oxygen doped polycrystalline silicon is provided by the oxynitride.

Finally, a post-deposition anneal is performed. Upon annealing, the oxides dissolve between the amorphous grains, setting the recombination velocity of the monocrystalline surface. Thus, oxygen is locally segregated, eliminating the native oxide of the monocrystalline region surface, and the final boundary recombination velocity of the monocrystalline region is set.

Figure 23:
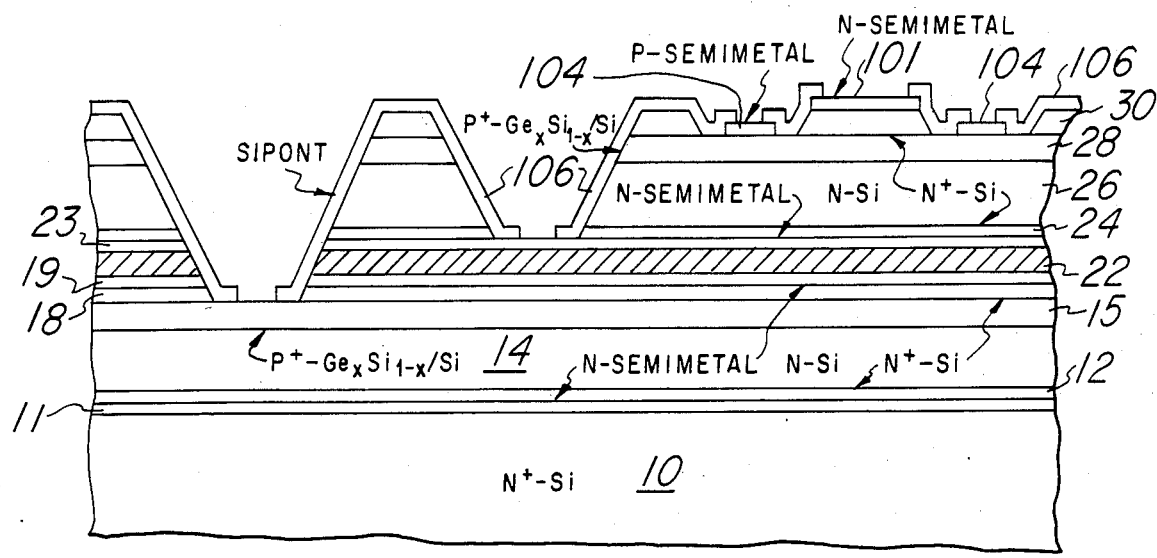
FIG. 23 is a side elevational cross-sectional view of a SIPONT passivated half H-bridge.
Figure 24:
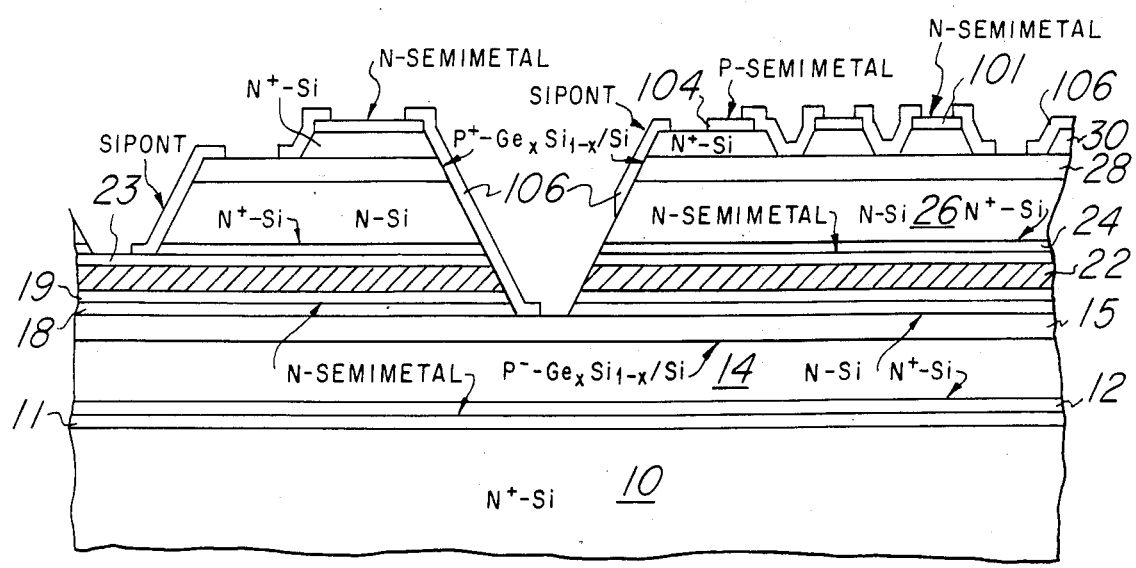
FIG. 24 is a side elevational cross-sectional view of a a SIPONT passivated I²gate.

The SIPONT is etched by a developing resist, and serves as a mask for a dry plasma etch in $CF_4$, the etch stopping in the undoped silicon film overlying the n type semimetal and p type semimetal. A patterned SIPONT passivation layer 106 for a half H-bridge is shown in FIG. 23 and for an $I^2L$ gate and bipolar transistor in FIG. 24.

Figure 25:
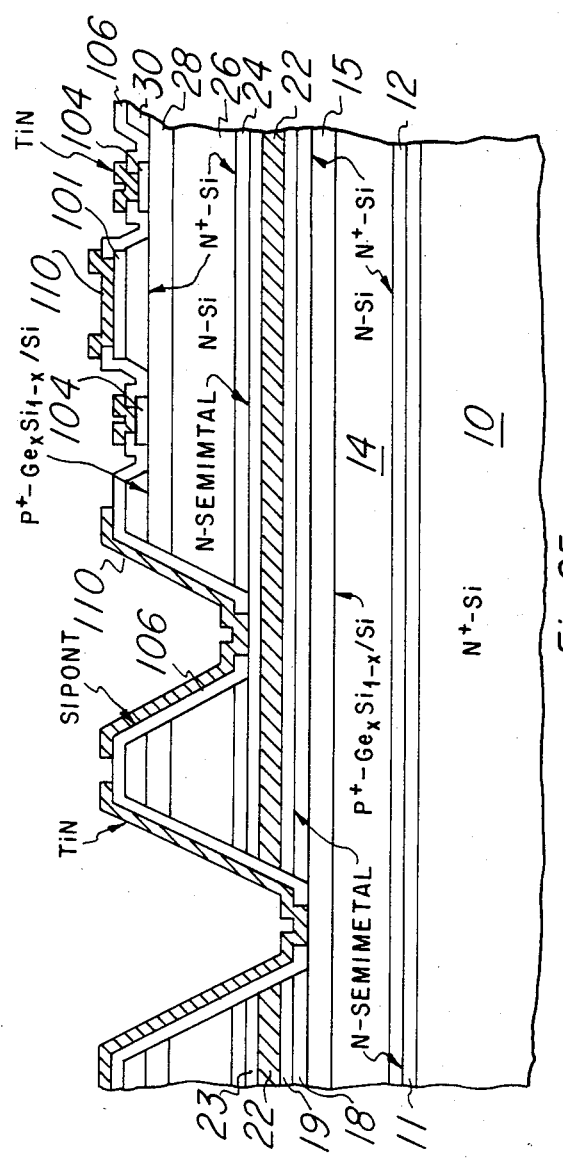
FIG. 25 is a side elevational cross-sectional view of a an half H-bridge, showing a first level interconnect.
Figure 26:
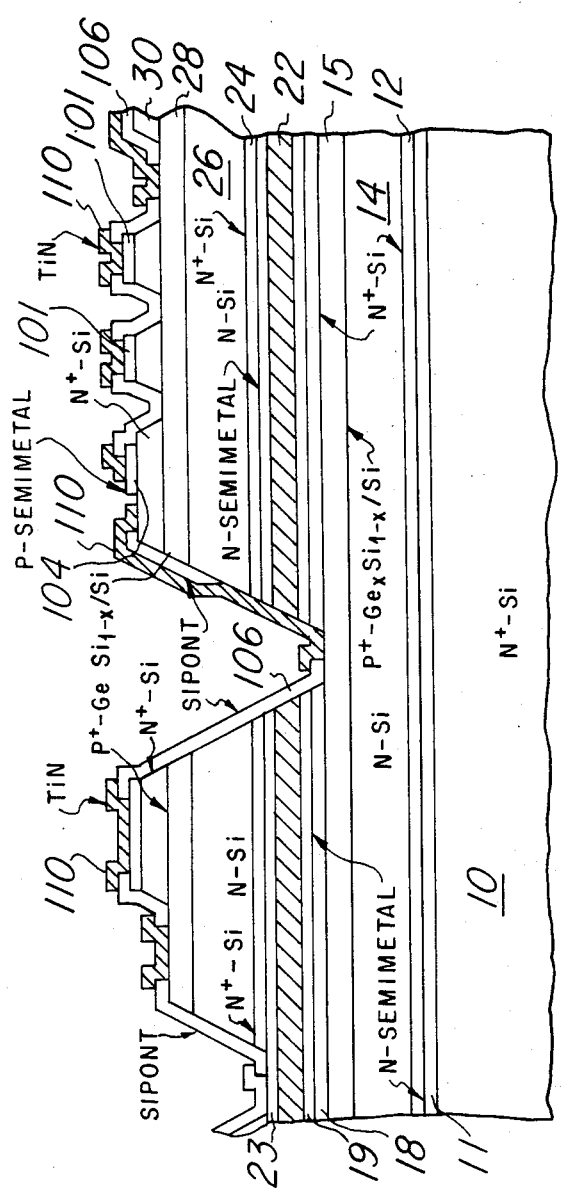
FIG. 26 is a side elevational cross-sectional view of a an I²L gate, showing a first level interconnect.

After SIPONT patterning, the wafer is subjected to a potassium hyudroxide wet etch to remove the undoped silicon overlying the n type semimetal and p type semimetal regions in order to expose the semimetal surface within the SIPONT apertures (both SIPONT and semimetals resist potassium hydroxide etching). A conductive glass, such as titanium nitride, is next deposited to serve as first level interconnect. A patterned titanium nitride layer 110 for a half H-bridge is shown in FIG. 25 and for an $I^2L$ gate and bipolar transistor in FIG. 26. The titanium nitride first level conductor has a conductivity virtually equivalent to pure titanium, and provides a diffusion barrier to metals, ions, and moisture, passivates the semimetal, and hermetically seals the wafer in conjunction with the SIPONT passivation. The titanium nitride is formed to a thickness of about 2000 Å by sputtering titanium in an argon/nitrogen environment with a sputtering pressure of about 15 millitorr and a power of about 4.5 KVA. The titanium nitride is patterned by using a dry $CF_4$ plasma etch with a resist mask (not shown).

Figure 27:
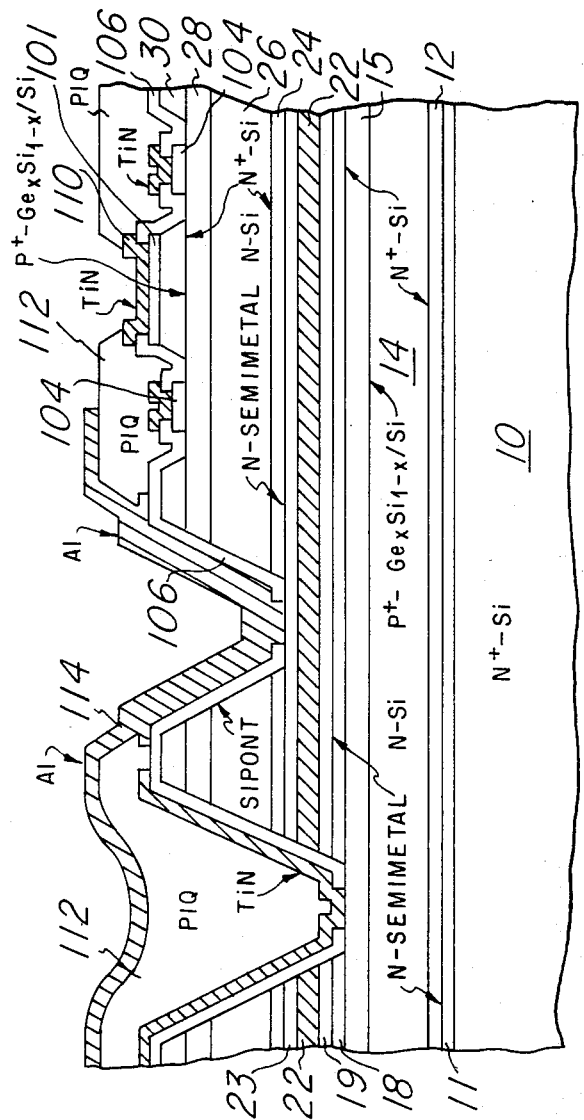
FIG. 27 is a side elevational cross-sectional view of a an half H-bridge, showing a second level interconnect.
Figure 28:
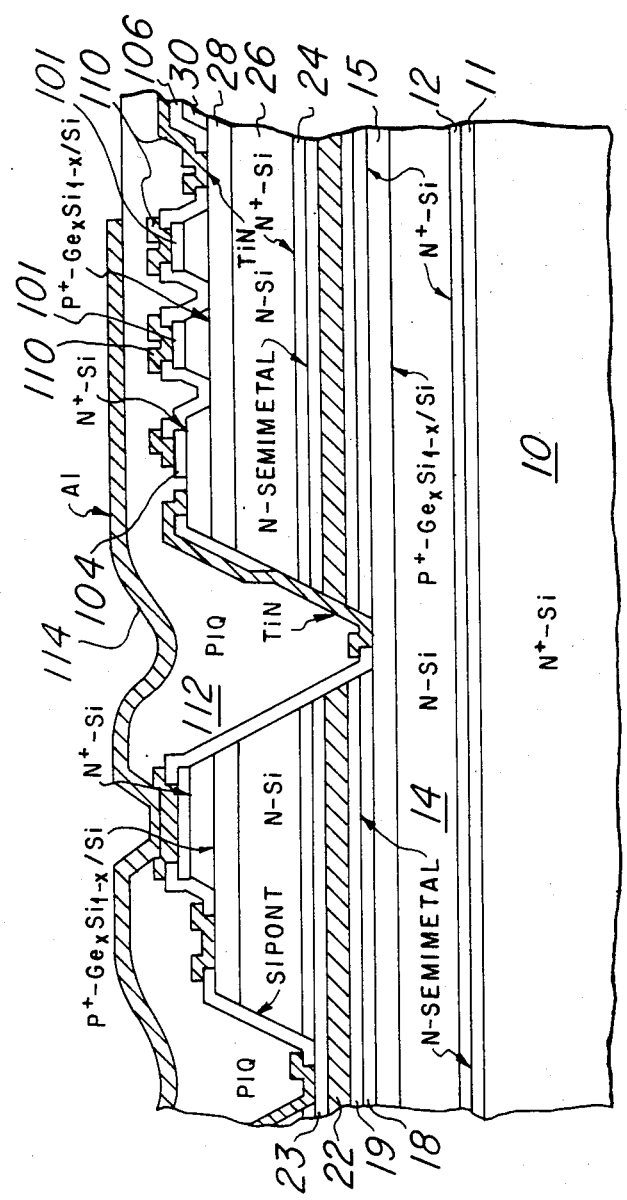
FIG. 28 is a side elevational cross-sectional view of a an I²L gate, showing a second level interconnect.

As shown in FIGS. 27 and 28, after titanium nitride patterning, an organic polyimide bulk dielectric 112 is applied. Although a variety of polyamic acid solutions may be utilized, it has been found that a polyamic acid sold under the Trademark "PIX 1400" by Hitachi, which incorporates a silicone coupler system, is particularly advantageously employed. The polyamic acid is spun or sprayed on the wafer to a thickness on the planar surface of between about 3 to 5 microns. The polyimide is then baked at about 100° C. for about 20 minutes prior to etch in order to partially imidize it in order to facilitate a sloped etch. Photoresist (not shown) is spun on, exposed, and developed to define the vias, and the polyimide is etched with isopropyl alcohol diluted tetramethyl ammonium hydroxide with ultrasonic agitation. The wafer is then baked at 210° C. to drive off solvents and the photoresist is stripped. Finally, the polyimide is fully imidized with a 350° C. bake.

The wafer are then ashed and another aluminum layer 114 is evaporated or sputtered onto the wafer to form second level interconnect. Since the second level interconnect serves as a power bus to supply the half H-bridge output, amongst other purposes, the metal is 2-3 microns thick. The aluminum is patterned by appropriate lithographic and etching techniques. It will be noted that the aluminum is only in contact with two types of surfaces: titanium nitride or polyimide. The titanium nitride forms a metallic diffusion barrier to the underlying inorganic regions. Furthermore, both the titanium nitride and polyimide films contain no phosphorous and provide a barrier to ionic and halide penetration; hence, the aluminum is not subject to anodic or cathodic corrosion as is the normal case for conventional wafer processes. This is of particular interest in high voltage device applications.

Figure 29:
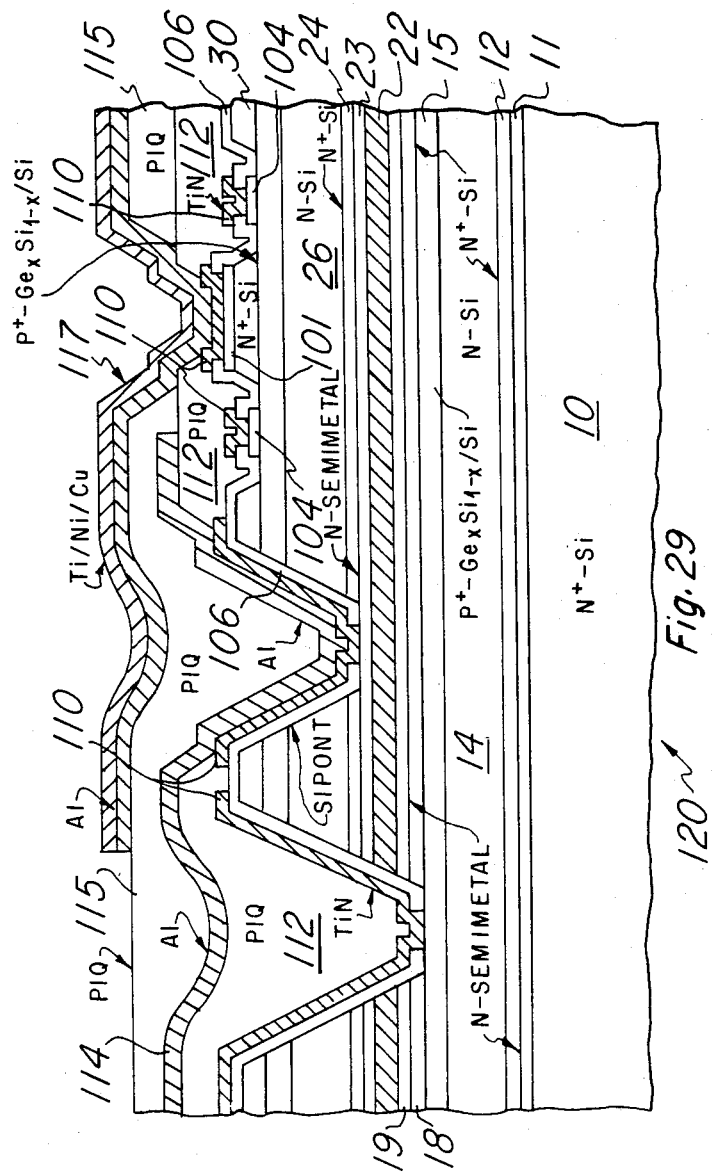
FIGS. 29 and 30 are side elevational cross-sectional views of the finally patterned wafers.
Figure 30:
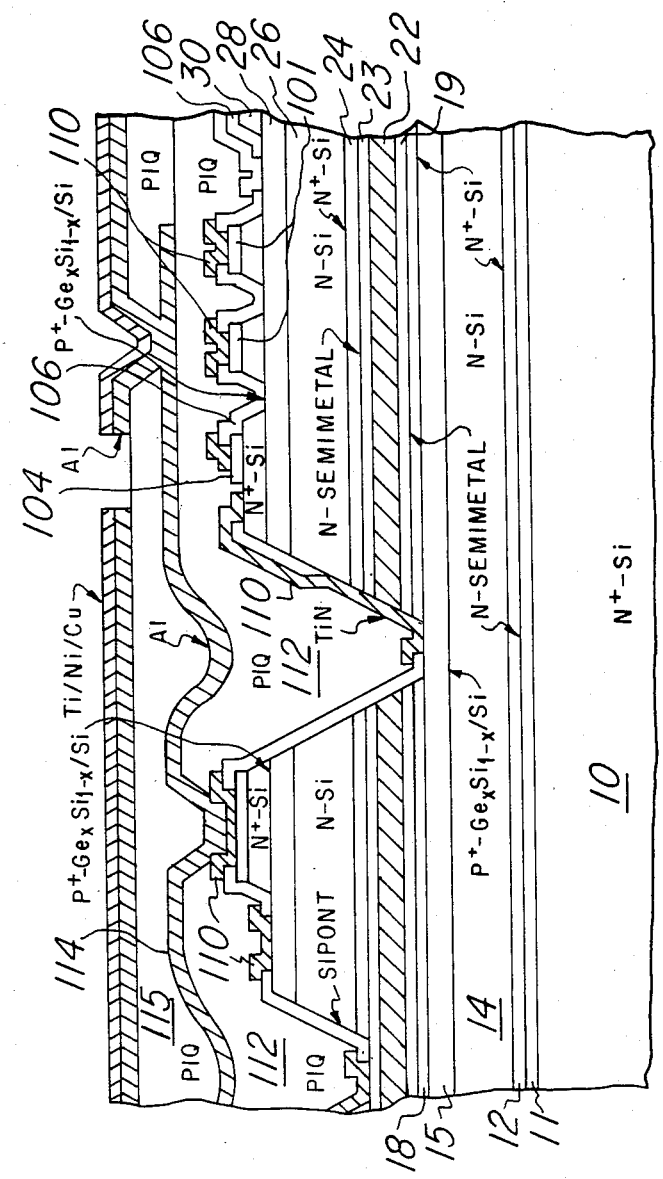

As shown now, with reference to FIGS. 29 and 30, a second coat 115 of polyimide is deposited and patterned as before to provide dielectric isolation for the third level interconnect. A multimetal sandwich 117 of aluminum, titanium, nickel, and copper is evaporated over the patterned polyimide dielectric 115. The multimetal sandwich 117 provides a non-corrosive, high current density metal system suitable for solder die contact. The aluminum serves as the primary conductor, the titanium serves as an adhesion promoter, and the nickel and copper serve as a non-corrosive metal system. The titanium and nickel have an intermetallic phase transition. An example of a suitable multimetal system is: aluminum (2-3 microns), titanium (1000 Å), titanium-nickel (1000 Å), nickel (2500 Å), and copper (4000 Å). The multimetal sandwich is easily patterned with a single photoresist, three stage wet etch process. The copper is etched with a dilute nitric acid, $HNO_3(40\%)$:$H_2O(60\%)$, for about 15 seconds; the titanium and nickel are etched with a hydrogen peroxide solution, $N_2O_2(5\%)$:$HF(5\%)$:$H_2O(90\%)$, for about 45 seconds; and the aluminum is etched with a phosphoric acid solution, $H_3PO_4(76\%)$:$HNO_3(3\%)$:$CH_3COOH(15\%)$:$H_2O(5\%)$, for approximately five minutes.

Figure 31:
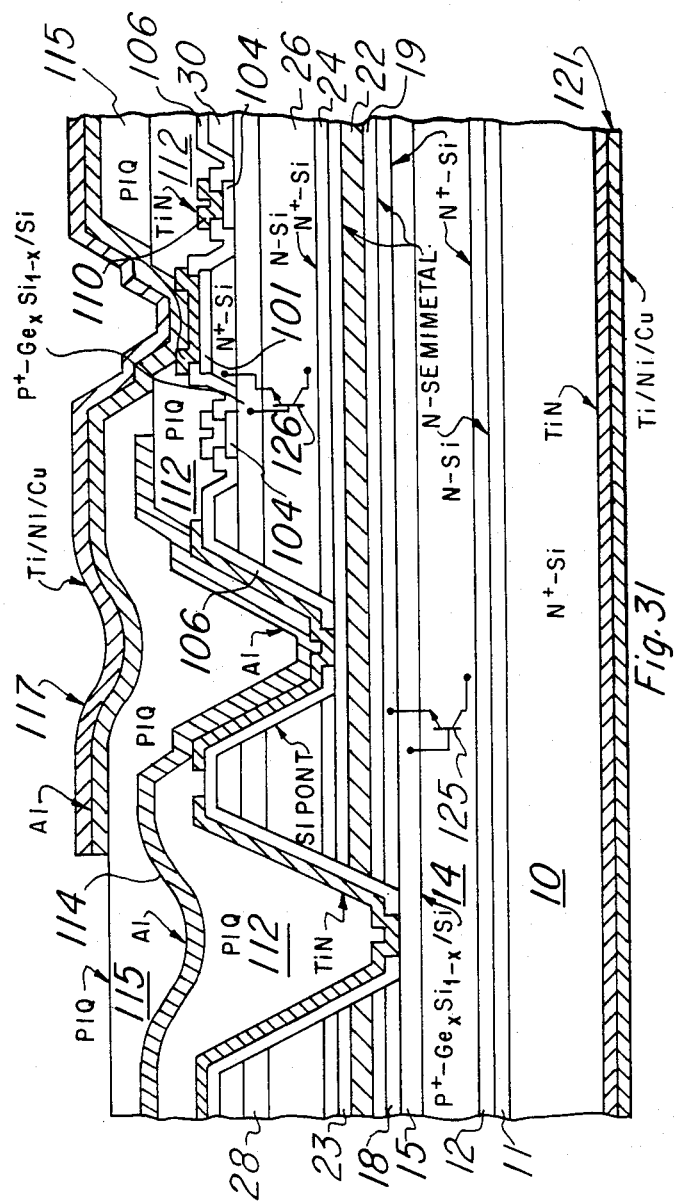
FIG. 31 is a side elevational cross-sectional view of a fully processed wafer presenting a half H-bridge, in accordance with the invention.
Figure 32:
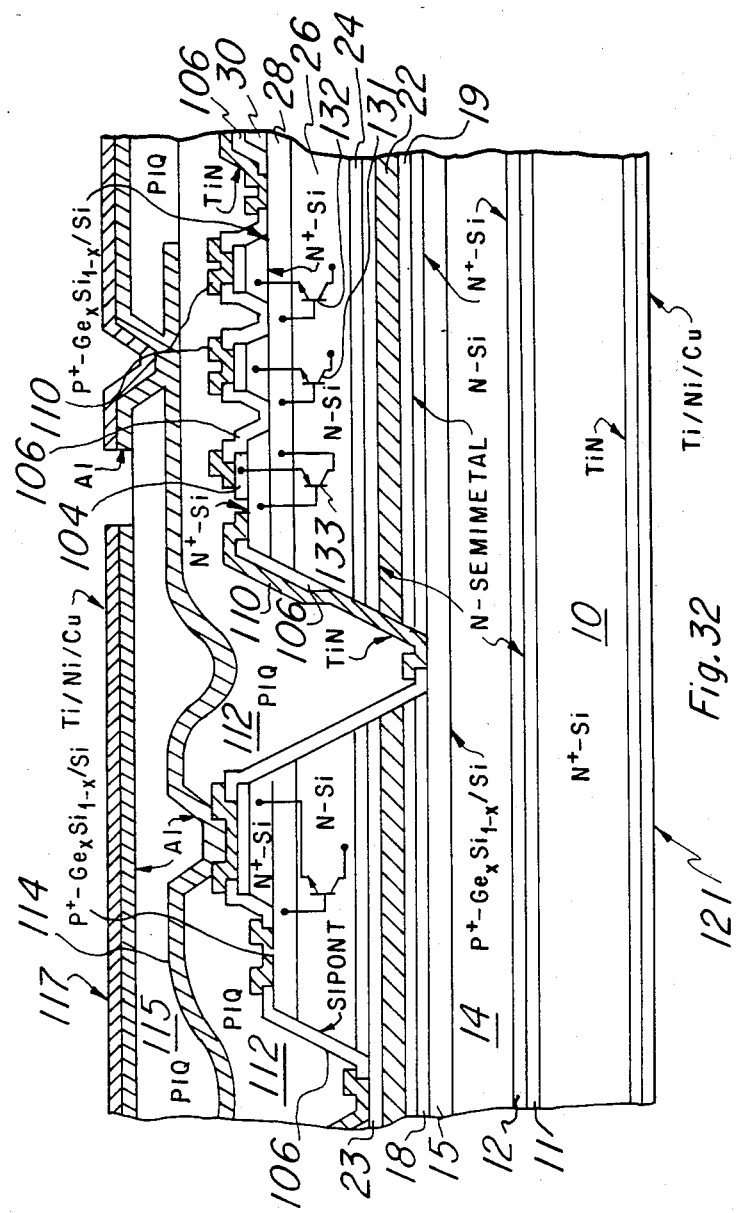
FIG. 32 is a side elevational cross-sectional view of a fully processed wafer presenting an I²L gate, in accordance with the invention.

After final multimetal patterning, the back side of the wafer is ground to a desired thickness, for example, 15 mils, and a back side metal system 121 is deposited as shown in FIGS. 31 and 32. The backside metal system 121 can be, for example, a sputtered titanium nitride film with an overlaying multimetal system of titanium, nickel, and copper similar to the topside metallurgy.

Die contact can be established by electrochemically plating solder (not shown) to the wafer backside 121 and selectively electrochemically plating solder or copper/solder pedestals (not shown) to the wafer topside.

Figure 33:
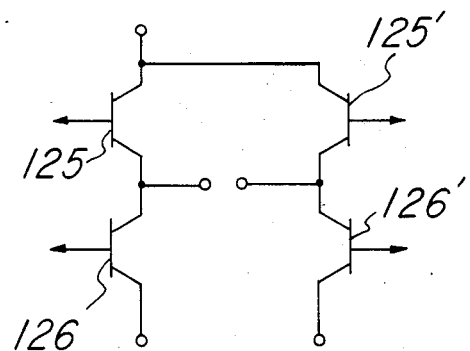
FIG. 33 is an electrical schematic diagram showing a full H-bridge.

A vertical, three dimensional half H-bridge bipolar structure shown in FIG. 31 can easily be configured in a full H-bridge configuration as shown in FIG. 33, and can be used, for example to provide direct motor drive or other H-bridge or totem pole power applications. The H-bridge circuit includes sink and source double heterojunction bipolar transistors 125 and 126, and 125' and 126', as described in copending patent application Ser. No. 883,876, filed July 9, 1986, entitled COMPOSITIONAL DOUBLE HETEROJUNCTION TRANSISTOR, by the applicant herein, said application being assigned to the assignee hereof, and incorporated herein by reference. For convenience, the schematic symbol for the transistors 125 and 126 are shown superimposed on the wafer 40 shown in FIG. 31. High gain and low base resistance can be realized by this circuit, as well as high voltage, high power device capability. The devices have excellent voltage, charge, and thermal isolation due to the V-Groove mesa isolation and the passivation system. The sink and source geometries are essentially vertically stacked in order to efficiently utilize the wafer planar area for cost considerations. The power bus metals are each contained in separate planes with a highly efficient metallurgy system. The components are essentialy hermetically sealed in wafer form. The transistor cut-in voltages, offset voltages, and temperature characteristics are controlled by design by varying the semimetal boundary film, as discussed above.

Figure 34:
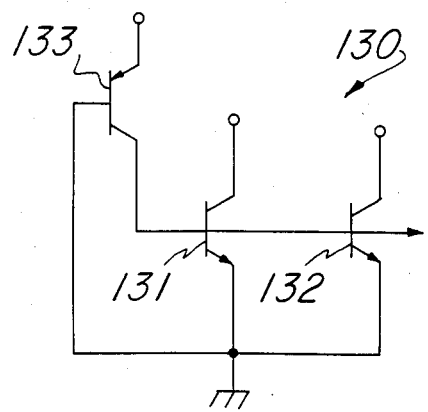
FIG. 34 is an electrical schematic diagram showing an I²L gate.

An I²L gate structure 130 including first and second NPN transistors 131 and 132, together with an PNP analog bipolar transistor 133 are shown schematically in FIG. 34. The wafer structure 40 of FIG. 32 can easily be configured to include such I²L structure 130 and bipolar transistor 133. Again, schematic diagrams of the transistors 131-133 are superimposed on the wafer structure illustrated in FIG. 32. High performance analog circuitry is realized with high performance vertical, double heterojunction NPN transistors along with accurate resistors formed by the semimetal films. Again mesa isolation provides excellent component stability and excellent component matching is achieved due to the non-compensated processing techniques that preserve crystal periodicity.

Extremely efficient logic is realized by the double heterojunction I²L logic gates 130. High reverse NPN gains are achieved by controlling the base and emitter chemostatic potentials. Low base resistance, that is, low injector current, are achieved due to the high doping concentration of the p+ type $Ge_xSi_{1-x}$/Si superlattice 28. The I²L collectors are mesa isolated to eliminate crosstalk. The cut-in voltages are controlled in order to establish the proper noise immunity over the operating temperature range. The masked ion beam lithography allows for fine line features in order to maximize the component packing density.

The process itself is efficient and cost efficient and cost effective. All active devices are fabricated in a non-compensated epitaxial strata with atomic control in an ultra high vacuum environment. No oxidations or diffusions are employed in order to preserve crystal perfection. All processing is performed at relatively low temperatures in order the maintain hyperabrupt junctions. All active device parameters are primarily established prior to the fist masking operation. Only eleven masking operations are required to delineate and to connect the components, which includes triple level interconnect and hermetic wafer capability.

Three masking operations are required to crystallographically expose all the proper epitaxial strata contact points, two masking operations are required to pattern the semimetal contact to the monocrystalline region in order to properly terminate the crystal, and six masking oerations are required to pattern the vias and metals to support triple level interconnect.

It can therefore been seen, that the structure is realized to a totally bipolar wafer process employing double heterojunction transistors in a three dimensional, non-compensated epitaxial strata in order to efficiently integrate high voltage, high power, analog, and digital circuitry. The process is well suited for motor applications and is extremely economical owing to the bipolar nature, minimal masking operations, large wafer diameter capability, and three dimensional aspect.

Although the invention has been described and illustrated with a certain degree of particularity, it is understood that the present disclosure has been made by way of example only and that numerous changes in the combination and arrangement of parts or steps may be resorted to those skilled in the art without departing from the spirit and the scope of the invention as hereinafter claimed.

I claim:

1. A three dimensional, bipolar wafer process for integrating high voltage, high power, analog, and digital circuitry, comprising:

(a) providing a wafer of non-compensated epitaxial strata on a heavily donor doped monocrystalline silicon substrate of <100> crystal orientation including:

i. an n type semimetal layer;
    ii. a first n+ type silicon region;
    iii. a first n type silicon region;
    iv. a first $Ge_xSi_{1-x}$/Si superlattice;
    v. a second n+ type silicon region;
    vi. an n type semimetal boundary;
    vii. a monocrystalline conductor;
    viii. n type semimetal boundary;
    ix. a third n+ type silicon region;
    x. a second n type silicon region;
    xi. a second $Ge_xSi_{1-x}$Si/supperlattice;
    xii. a fourth n+ type region;
    xiii. an n type semimetal boundary;

(b) etching said wafer to expose predetermined strata of said wafer;
    (c) forming at least one set of cascode double heterojunction transistors in said epitaxial strata;
    (d) establishing passivation for and contacts to said circuits;
    (e) and interconnecting the circuits.

2. The process of claim 1 wherein said step of forming said wafer of non-compensated epitaxial strata comprises sequentially epitaxially depositing each strata in an UHV silicon-based MBE apparatus.

3. The process of claim 1 wherein said step of forming said wafer of non-compensaated epitaxial strata comprises forming guest and host wafers, each containing respective portions of said layers, and fusing said guest and host wafers together.

4. The process of claim 1 wherein said steps of etching said wafer comprises preferentially etching said wafer.

5. The process of claim 4 wherein said step of forming at least one set of cascode double heterojunction transistors comprises forming an H-bridge circuit in said epitaxial strata.

6. The process of claim 5 wherein said step of forming an H-bridge circuit in said epitaxial strata comprises forming a cascode source NPN transistor with said first n+ type silicon region as a collector boundary, said first n type silicon region as a collector, said first $Ge_xSi_{1-x}$/Si superlattice as a base, and said second n+ type silicon region as an emitter, and forming a cascode sink NPN transistor with said third n+ type silicon region as a collector boundary, said second n type silicon region as a collector, said second $Ge_xSi_{1-x}$/Si superlattice as a base, and said fourth n+ type region as an emitter.

7. The process of claim 4 wherein said step of forming at least one set of double heterojunction transistors comprises forming an I²L circuit in said strata.

8. The process of claim 7 wherein said step of forming an I²L circuit in said epitaxial strata comprises forming a p type semimetal on said fourth n+ type semimetal layer, and forming a PNP transistor with said p type semimetal as an emitter, said fourth n+ type semimetal layer as a base, and said second $Ge_xSi_{1-x}$/Si superlattice as a collector, and forming at least another NPN transistor with said third n+ type silicon region as an emitter boundary, said second n type silicon region as an emitter, said second $Ge_xSi_{1-x}$/Si superlattice as a base, and said fourth n+ type region as an collector.

9. The process of claim 4 wherein said step of forming at least one set of double heterojunction transistors comprises:

forming an H-bridge circuit in said epitaxial strata, including at least one set of double heterojunction transistors;

and forming a bipolar transistor and an I²L circuit in said strata, including at least one set of double heterojunction transistors.

10. The process of claim 9 wherein said step of forming an H-bridge circuit in said epitaxial strata comprises forming a cascode source NPN transistor with said first n+ type silicon region as a collector boundary, said first n type silicon region as a collector, said first $Ge_xSi_{1-x}$/Si superlattice as a base, and said second n+ type silicon region as an emitter, and forming a cascode sink NPN transistor with said third n+ type silicon region as a collector boundary, said second n type silicon region as a collector, said second $Ge_xSi_{1-x}$/Si superlattice as a base, and said fourth n+ type region as an emitter, and wherein said step of forming a bipolar transistor in said epitaxial strata comprises forming a PNP transistor inlcudes forming a p type semimetal on said fourth n+ type semimetal layer, with said p type semimetal as an emitter, said fourth n+ type semimetal layer as a base, and said second $Ge_xSi_{1-x}$/Si superlattice as a collector, and wherein said step of forming an I²L circuit in said epitaxial strata comprises forming at least another NPN transistor with said third n+ type silicon region as an emitter boundary, said second n type silicon region as an emitter, said second $Ge_xSi_{1-x}$/Si superlattice as a base, and said fourth n+ type region as an collector.

11. The process of claim 1 wherein said n type semimetal boundaries are each deposited to a thickness of between about 0.5 to 1.0 microns.

12. The process of claim 1 wherein said first n+ type silicon region is formed to a thickness of about one micron with a donor concentration of about $5 \times 10^{17}$ atoms/cm³.

13. The process of claim 12 wherein said first n+ type silicon region is counter-doped with isoelectronic germanium atoms to controllably increase its bulk recombination rate.

14. The process of claim 1 wherein said first n type silicon region is of thickness greater than 10 microns with a donor doping concentrations less than $1 \times 10^{15}$ atoms/cm³.

15. The process of claim 1 wherein said second n+ type silicon region is formed with a chemostatic potential magnitude greater than that of the first $Ge_xSi_{1-x}$/Si region to favor electron injection into the first $Ge_xSi_{1-x}$/Si region with a favored transmission of electrons from a contact to the second n+ type silicon region by a drift field and very high reflection of holes injected into the second n+ type silicon region from the first $Ge_xSi_{1-x}$/Si region.

16. The process of claim 15 further comprising causing the bias controleld junction currents to be dominated by space charge recombination effects due to large divergence of mobile carrier velocities between the second n+ type silicon region and the first $Ge_xSi_{1-x}$/Si region, and obtaining a desired cut-in voltage, roll-off voltage, and peak gain operating point by increasing the recombination velocity of the second n+ type silicon region.

17. The process of claim 16 wherein said step of increasing the recombiantion velocity of the second n+ type silicon region is done by varying the semimetal isotype Schottky barrier height of the second n+ type silicon region by adjusting the semimetal donor and oxygen concentrations.

18. The process of claim 16 wherein said step of increasing the recombination velocity of the second n+ type silicon region is done by germanium counter-doping the second n+ type silicon region to increases the silicon midband traps, and activating the germanium atoms by rapid thermal annealing to raise the intrinsic carrier concentration and alter the recombination velocity of the second n+ type silicon region.

19. The process of claim 18 wherein said step of germanium counter-doping the second n+ type silicon region is by concurrent donor and germanium low energy implantation during silicon evaporation in a UHV silicon-based MBE.

20. The process of claim 1 wherein said monocrystalline conductor is $NiSi_2$.

21. The process of claim 20 further comprising controlling the impedance by varying the $NiSi_2$ thickness.

22. The process of claim 1 wherein said monocrystalline conductor is $CoSi_2$.

23. The process of claim 1 wherein said the first n+ type monocrystalline silicon region is formed to a thickness of between about 10 to 15 microns, and further comprising doping the first n type silicon region to a donor concentration of between about $1 \times 10^{14}$ atom/cm³ to $5 \times 10^{15}$ atom/cm³.

24. The process of claim 1 wherein said third n+ type region is germanium counterdoped.

25. The process of claim 1 wherein said third n+ type region is a has a substantially moncrystalline film with a donor doping concentration immediately adjacent the second $Ge_xSi_{1-x}$/Si region.

26. A three dimensional, bipolar wafer process for integrating high voltage, high power, analog, and digital circuitry, comprising:
(a) providing a wafer of non-compensated epitaxial strata on a heavily donor doped monocrystalline silicon substrate of <100> crystal orientation including:
   i. an n-semimetal layer of thickness between about 0.5 to 1.0 microns;
   ii. a first n+ type silicon region having a thickness of between about one to 15 microns with a donor concentration of about $5 \times 10^{17}$ atoms/cm³;
   iii. a first n type silicon region of thickness greater than 10 microns with a donor doping concentrations between about $1 \times 10^{14}$ atom/cm³ to $5 \times 10^{15}$ atom/cm³;
   iv. a first $Ge_xSi_{1-x}$/Si superlattice of thickness of less than 1 micron and having an acceptor doping concentration of at least $10^{20}$ atoms/cm³;
   v. a second n+ type silicon region having a thickness of between about one to 15 microns with a donor concentration of about $5 \times 10^{17}$ atoms/cm³;
   vi. an n type semimetal boundary of thickness between about 0.5 to 1.0 microns;
   vii. a monocrystalline conductor of monocrystalline $NiSi_2$;
   viii. n type semimetal boundary of thickness between about 0.5 to 1.0 microns;
   ix. a third n+ type silicon region having a thickness of between about one to 15 microns with a donor concentration of about $5 \times 10^{17}$ atoms/cm³;
   x. a second n type silicon region of thickness greater than 10 microns with a donor doping concentrations between about $1 \times 10^{14}$ atom/cm³ to $5 \times 10^{15}$ atom/cm³;

xi. a second $Ge_xSi_{1-x}$/Si superlattice of thickness of less than 1 micron and having an acceptor doping concentration of at least $10^{20}$ atoms/cm$^3$;

xii. a fourth n+ type region having a thickness of between about one to 15 microns with a donor concentration of about $5 \times 10^{17}$ atoms/cm$^3$;

xiii. an n type semimetal boundary of thickness between about 0.5 to 1.0 microns;

(b) etching said wafer to expose predetermined strata of said wafer;

(c) forming an H-bridge circuit in said epitaxial strata including at least one set of double heterojunciton transistors by forming a cascode source NPN transistor with said first n+ type silicon region as a collector boundary, said first n type silicon region as a collector, said first $Ge_xSi_{1-x}$/Si superlattice as a base, and said second n+ type silicon region as an emitter, and forming a cascode sink NPN transistor with said third n+ type silicon region as a collector boundary, said second n type silicon region as a collector, said second $Ge_xSi_{1-x}$/Si superlattice as a base, and said fourth n+ type region as an emitter.

(d) forming a bipolar transistor in said epitaxial strata, including forming a p type semimetal on said fourth n+ type silicon layer, with said p type semimetal as an emitter, said fourth n+ layer as a base, and said second $Ge_xSi_{1-x}$/Si superlattice as a collector, and forming an I$^2$L circuit in said epitaxial strata including at least two NPN transistors each with said third n+ type silicon region as an emitter boundary, said second n type silicon region as an emitter, said second $Ge_xSi_{1-x}$/Si superlattice as a base, and said fourth n+ type region as a collector.

(e) establishing passivation for and contacts to said circuits;

(f) and interconnecting the circuits.

27. The process of claim 26 wherein said step of forming said wafer of non-compensated epitaxial strata comprises sequentially epitaxially depositing each strata in an UHV silicon-based MBE apparatus.

28. The process of claim 26 wherein sid step of forming said wafer of non-compensated epitaxial strata comprises forming guest and host wafers, each containing respective portions of said layers, and fusing said guest and host wafers together.

29. The process of claim 26 wherein the steps of etching said wafer comprises preferentially etching said wafer.

30. The process of claim 26 wherein said first n+ type silicon region is counter-doped with isoelectronic germanium atoms to controllably increase its bulk recombination rate.

31. The process of claim 26 wherein said second n+ type silicon region is formed with a chemostatic potential magnitude greater than that of the first $Ge_xSi_{1-x}$/Si region to favor electron injection into the first $Ge_xSi_{1-x}$/Si region with a favored transmission of electrons from a contact to the second n+ type silicon region by a drift field and very high reflection of holes injected into the second n+ type silicon region from the first $Ge_xSi_{1-x}$/Si region.

32. The process of claim 31 further comprising causing the bias controlled junction currents to be dominated by space charge recombination effects due to large divergence of mobile carrier velocities between the second n+ type silicon region and the first $Ge_xSi_{1-x}$/Si region, and obtaining a desired cut-in voltage, roll-off voltage, and peak gain operating point by increasing the recombination velocity of the second n+ type silicon region.

33. The process of claim 32 wherein said step of increasing the recombination velocity of the second n+ type silicon region is done by varying the semimetal isotype Schottky barrier height of the second n+ type silicon region by adjusting the semimetal donor and oxygen concentrations.

34. The process of claim 32 wherein said step of increasing the emitter recombination velocity is done by germanium counter-doping the second n+ type silicon region to increases the silicon midband traps, and activating the germanium atoms by rapid thermal annealing to raise the intrinsic carrier concentration and alter the recombination velocity of the second n+ type silicon region.

35. The process of claim 34 wherein said step of germanium counter-doping the second n+ type silicon region is by concurrent donor and germanium low energy implantation during silicon evaporation in a UHV silicon-based MBE.

36. The process of claim 26 further comprising controlling the impedance of said monocrystalline conductor by varying the NiSi$_2$ thickness.

37. The process of claim 26 wherein said third n+ type region is germanium counterdoped.

38. The process of claim 26 wherein said third n+ type region is a has a substantially monocrystalline film with a donor doping concentration immediately adjacent the second $Ge_xSi_{1-x}$/Si region.

* * * * *